US012775209B2

(12) United States Patent
Jiang et al.

(10) Patent No.: US 12,775,209 B2
(45) Date of Patent: Oct. 27, 2026

(54) STABILITY-ENHANCED ORGANOTIN PHOTORESIST COMPOSITIONS

(71) Applicant: Inpria Corporation, Corvallis, OR (US)

(72) Inventors: Kai Jiang, Corvallis, OR (US); Alan J. Telecky, Albany, OR (US); Stephen T. Meyers, Corvallis, OR (US)

(73) Assignee: Inpria Corporation, Corvallis, OR (US)

( * ) Notice: Subject to any disclaimer, the term of this patent is extended or adjusted under 35 U.S.C. 154(b) by 770 days.

(21) Appl. No.: 17/982,013

(22) Filed: Nov. 7, 2022

(65) Prior Publication Data

US 2023/0143592 A1 May 11, 2023

Related U.S. Application Data

(60) Provisional application No. 63/276,749, filed on Nov. 8, 2021.

(51) Int. Cl.
*G03F 7/004* (2006.01)

(52) U.S. Cl.
CPC .......... *G03F 7/0042* (2013.01); *G03F 7/0048* (2013.01)

(58) Field of Classification Search
CPC .... G03F 7/0042; G03F 7/0043; G03F 7/0048; G03F 7/2004
See application file for complete search history.

(56) References Cited

U.S. PATENT DOCUMENTS 8,415,000 B2 * 4/2013 Stowers ................ G03F 7/0042 423/325
9,310,684 B2 4/2016 Meyers et al.
(Continued)

FOREIGN PATENT DOCUMENTS

WO 2012-099253 A1 7/2012
WO 2020-132281 A1 6/2020
WO 2023-245047 A1 12/2023

OTHER PUBLICATIONS

Mack, “Fundamental Principles of Optical Lithography”, John Wiley & Sons, Chichester, U.K, p. 271-271, (2007). (Abstract).
(Continued)

*Primary Examiner* — John S. Chu
(74) *Attorney, Agent, or Firm* — Christensen, Fonder, Dardi, Busse; Diane E. Bennett; Peter S. Dardi

(57) ABSTRACT

An organotin precursor solution is described comprising an organic solvent, an optional additive, and an organotin composition represented by one or more organotin compounds represented by the formula $RSnL_3$, wherein each R is independently a hydrocarbyl ligand having from 1 to 31 carbon atoms and each L is independently a hydrolysable ligand, wherein the total concentration of Sn is from about 0.001 M to about 0.5 M. The solvent can comprises a linear alcohol with from 1 to 6 carbon atoms, and the organotin precursor solution can have an initial water content from about 100 ppm to about 10,000 ppm, in which the organotin precursor solution has a reduced rate of water dissipation relative to an equivalent organotin precursor solution formed with 4-methyl-2-pentanol. The organotin precursor solutions can be prepared through the selection of an appropriate stabilizing compound, which can be a linear, short chain alcohol and an appropriate additive.

29 Claims, 4 Drawing Sheets

(56) References Cited

U.S. PATENT DOCUMENTS

| | | | | |
|---|---|---|---|---|
| 10,228,618 | B2 | 3/2019 | Meyers et al. | |
| 10,642,153 | B2 | 5/2020 | Meyers et al. | |
| 10,649,328 | B2 | 5/2020 | Stowers et al. | |
| 11,098,070 | B2 * | 8/2021 | Cardineau | G03F 7/2004 |
| 11,300,876 | B2 | 4/2022 | Jiang et al. | |
| 11,329,028 | B2 | 5/2022 | Shih | |
| 2012/0223418 | A1 | 9/2012 | Stowers et al. | |
| 2016/0116839 | A1 * | 4/2016 | Meyers | G03F 7/2004 430/326 |
| 2017/0102612 | A1 * | 4/2017 | Meyers | G03F 7/30 |
| 2019/0137870 | A1 * | 5/2019 | Meyers | G03F 7/40 |
| 2019/0153001 | A1 * | 5/2019 | Cardineau | G03F 7/2004 |
| 2019/0308998 | A1 * | 10/2019 | Cardineau | C07F 7/2224 |
| 2019/0391486 | A1 | 12/2019 | Jiang et al. | |
| 2020/0124970 | A1 | 4/2020 | Kocsis et al. | |
| 2020/0239498 | A1 | 7/2020 | Clark et al. | |
| 2020/0241413 | A1 | 7/2020 | Clark et al. | |
| 2020/0257196 | A1 * | 8/2020 | Meyers | G03F 7/2004 |
| 2022/0006419 | A1 | 1/2022 | Conrad et al. | |
| 2022/0064192 | A1 | 3/2022 | Edson et al. | |

OTHER PUBLICATIONS

International Search Report from corresponding Patent Application No. PCT/US2022/049094 dated Mar. 21, 2023.

* cited by examiner

STABILITY-ENHANCED ORGANOTIN PHOTORESIST COMPOSITIONS

CROSS REFERENCE TO RELATED APPLICATIONS

This application claims priority to U.S. provisional patent application 63/276,749 filed Nov. 8, 2021 to Jiang et al., entitled "Additive Enhanced Organotin Photoresist Compositions," incorporated herein by reference.

FIELD OF THE INVENTION

The invention relates to organotin precursor solutions suitable for forming radiation patternable materials for lithographic patterning in which the solutions include stabilization compounds, cosolvents and/or additives, that provide reduced hydrolysis of ligands to stabilize the solutions.

BACKGROUND OF THE INVENTION

The semiconductor manufacturing process generally involves the iterative processing and patterning of many different layers of materials in order to fabricate devices. Initial patterning of each layer and material is enabled by the use of photolithography wherein a photosensitive material, called a photoresist, is used to form an initial pattern that is then transferred into the underlying substrate. This process is generally repeated many times until the desired device structure is realized. Therefore, photoresists are critical materials used in the fabrication of semiconductor devices.

DETAILED DESCRIPTION OF THE INVENTION

Figure 1:
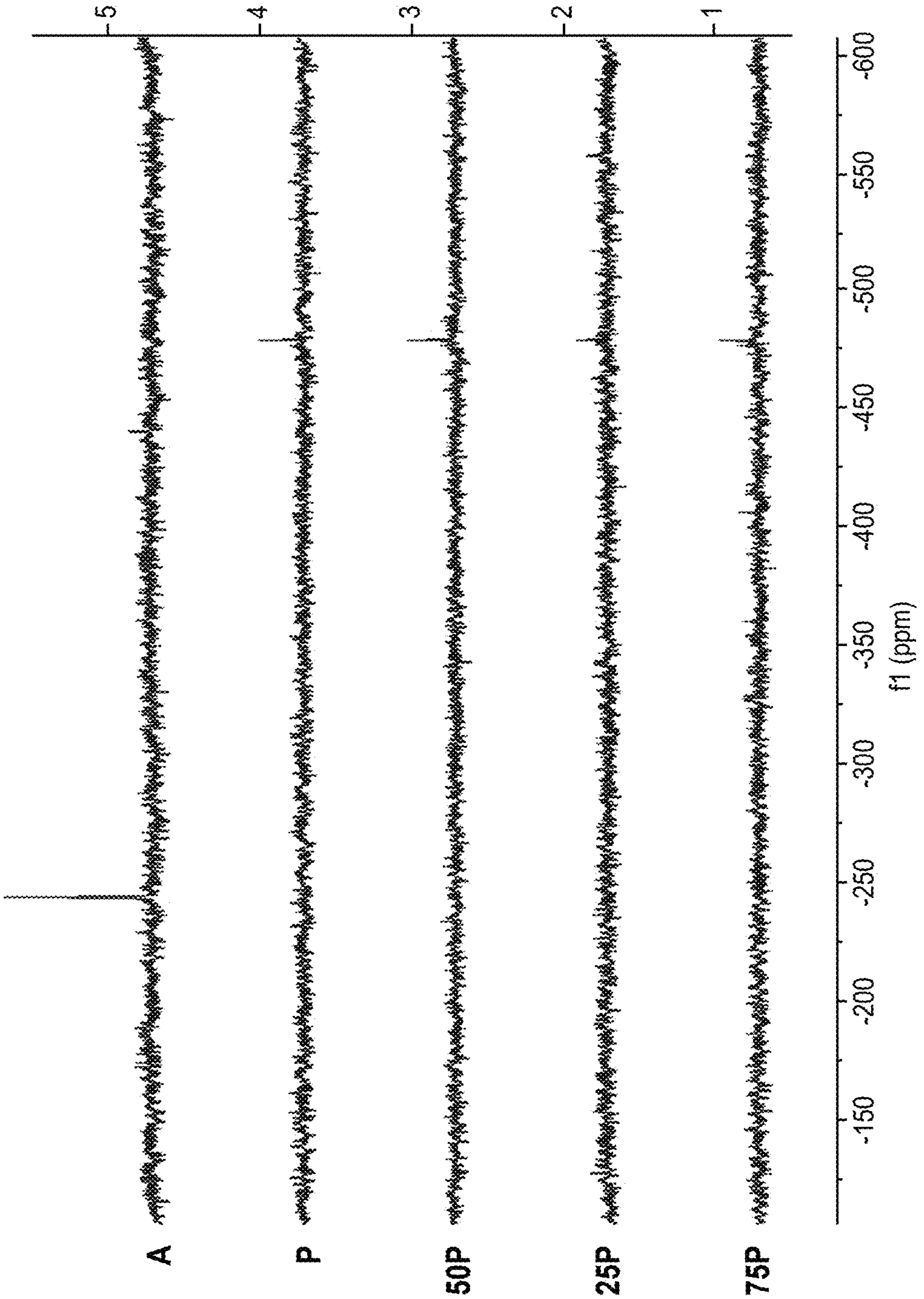
FIG. 1 is a series of $^{119}$Sn spectra of organotin solutions prepared with 4-methyl-2-pentanol solvent and various percentages of n-propanol co-solvent, with each solvent composition normalized to 300 ppm water.

Additives and/or solvent compositions, such as a solvent comprising a primary alcohol optionally with another solvent component, have been discovered that stabilize solutions of organotin compounds to improve shelf life and to facilitate consistent use as a radiation patterning composition. Properties of organotin precursor solutions can be evaluated with respect to evolution over time of the water content of the solutions relative to an initial water content since water content can be indicative of the degree of hydrolysis taking place as a result of trace water. Organotin compositions have been demonstrated to function as high resolution patterning compositions, and further improvements in stability of patterning compositions promises to further extend useful ranges of productive compositions. The formation of layers of the photopatterning compositions can be formed using solution coating processes using organotin photoresist precursor solutions. Both appropriately selected solvents and additives have been found to be useful to improve shelf life of desirable compositions as well as extend the range of practical precursor compositions that can be exploited for photo-patterning due to sufficient stability. Solvent blends can be particularly desirable to elicit stabilizing functionality while having flexibility to set other solution parameters, such as viscosity. As used herein, a cosolvent in a solvent blend is generally a liquid which provides desirable ligands for inhibiting cluster formation of the solvated organotin(IV) compounds. Unbranched primary alcohols (linear alcohols) have been found to serve this purpose as a solvent or a cosolvent. Additives are generally added in lesser amounts, such as in the same order of magnitude by mole as the tin ions provided by the organotin precursor, although additives may be at a significant multiple higher on a per mole basis. Additives can provide alternative ligands that compete with solvent ligands to stabilize the organotin compounds in solution. Proposed mechanism of the stabilization process are discussed below, although we do not want to be limited by theory. Regardless of the mechanism, the stabilization compounds, (co)solvents and/or additives, may also influence the composition of the processed radiation sensitive coatings, and potentially may increase the contrast for patterning between irradiated and un-irradiated portions of the coating as well as decreasing defects. The molecules of the stabilization compounds are believed to coordinate with the tin as ligands. Specifically, the cosolvents and/or the additive molecules can coordinate as ligands around the tin(IV) ions to stabilize the compounds against hydrolysis. Generally, processing and development can be followed unchanged.

The functions of the (co)solvents or additives are believed to be essentially comparable, although the mechanisms are generally not specifically elucidated. The concentrations generally just influence the ligand equilibria and are not generally believed to alter the fundamental mechanisms. Tin IV ($Sn^{+4}$) is thought to be able to accept up to six ligands. With one carbon-tin bond and three negatively charged ligands, that basic structure suggests the ability to accept two additional ligands. Solvent may be able to provide the one or two additional ligands with some corresponding ligand strength. As described herein, a cosolvent for inhibiting hydration by trace water is linear alcohols, n-HOR, where $R{=}(CH_2)_nCH_3$, n=0 to 5. In precursor solutions described herein, linear alcohols can delay or inhibit the binding of water ligands to the Sn, which can advantageously result in a delay of the hydrolysis of an alkoxy ligand to form a hydroxide ligand. To provide desired rheology for processing the solutions into patterning compositions on a substrate, the linear alcohols can be blended with another solvent, such as a secondary or tertiary alcohol. The examples use 4-methyl-2-pentanol (also known as methyl isobutyl carbinol or MIBC) blended with n-propanol. 4-methyl-2-pentanol has been the solvent of choice for Applicant's organotin product development due to convenient features for semiconductor processing. For this reason, 4-methyl-2-pentanol is used as a reference solvent for evaluation of stabilization related properties.

Additives can provide alternative ligands to complete the tin ligand shell to replace solvent ligands possibly with stronger ligand bond strengths. Suitable additives include carboxylic acids and halogenated derivatives thereof, which are shown to provide some stabilization. In some embodiments, it can be desirable to add multidentate ligand additives, which have a plurality of functional groups. Each multidentate ligands can form multiple bonds to the tin to provide added stability of the ligands. Bidentate ligands include, for example, diols, triols, diketones, amino alcohols, and amides (such as dimethylurea). The results in the examples below demonstrate that these additives can increase solution stability by inhibiting hydrolysis by trace water. Since the solvated tin moieties are prone to complex formation, having stronger ligand binding can limit hydrolysis and corresponding complexation and potential precipitation from agglomeration of complexes.

However, owing to the propensity of organotin compositions to hydrolyze and condense in solution, unwanted particulates in solution and associated coating defects can form over time. For example, hydrolysis of ostensibly monomeric (solvated) monoorganotin precursors, having 4-coordinate Sn atoms generally can result in the formation of oxo/hydroxo clusters having 5-coordinate and 6-coordinate Sn atoms, such as the well-known dodecameric "football" clusters represented by the formula $[(RSn)_{12}O_{14}(OH)_6](OH)_2$. Such clusters can continue to oligomerize through hydrolysis and condensation processes to form bulk precipitates and solids. It is therefore desirable to hinder hydrolysis and condensation processes in organotin photoresist solutions. It has been discovered that hydrolysis of organotin compositions in organic solvents can be hindered in the presence of suitable stabilization compounds. Reaction with water in solution is generally undesirable because it leads to polymerization of organotin species to form larger clusters that can agglomerate and/or precipitate in solution, and during use of the precursor composition, which can lead to solids forming in wafer tracks or to defects on the wafer or within the resist coating. Particles formed in the solution that do not form precipitates (such as suspended particles) can nevertheless be transferred into the subsequent coatings and can then result in coating defects and/or patterning defects.

While not wanting to be limited by theory, it is believed that suitable stabilization compounds can coordinate and/or complex with the Sn atoms to form hydrolysis-resistant species, though the mechanisms by which this occurs can vary. It is further believed that a bidentate additive can inhibit hydrolysis by forming bonds between a Sn and two or more reactive groups of an additive molecule (e.g. two —OH groups of a diol), thereby providing both an energetic and an entropic advantage to hindering hydrolysis. In general, the stabilization compounds can substitute for the hydrolysable ligands and/or can form additional ligands to result in 5-coordinate or 6-coordinate Sn.

The reactivity and propensity of RSn moieties to form higher coordination numbers can also generally be influenced by the identity of the R ligand. For example, larger and bulkier R groups can sterically hinder bulky alcohols and other species from reacting, complexing, and/or coordinating with the Sn atom. As shown in the Examples below, organotin precursors solvated by bulky secondary alcohols, such as 4-methyl-2-pentanol, generally comprise 4-coordinate Sn atoms which are susceptible to reaction and displacement with small molecule reactants, such as water, methanol, or n-propanol. However, when molecules other than water form clusters and species having 6-coordinate Sn environments the resulting species remain soluble. While not wanting to be limited by theory, it is believed that coordination and/or complexation of the RSn moieties with suitable non-water molecules, such as those able to satisfy the coordination number of Sn, hinders the propensity of the organotin species to condense and oligomerize. By hindering the organotin species' propensities towards condensation, the homogeneity of the photoresist solution and the coatings derived from them can be improved. It is therefore believed that additives and solvents that can coordinate with and/or complex with monomeric organotin precursors to form soluble products having 5- or 6-coordinate Sn environments is desirable.

The overall concoction would generally involve equilibria between a wide range of potential species, that may be distinguished by identity of ligands, arrangement of ligands, potential of some bridging of ligands, and transient or non-transient clustering. In the solution, the species at any particular time depends on the balance of the various equilibrium of particular species, which can involve interconnections, that result in extremely complex relationships. In general, these complexities are unimportant except with respect to functionality for the intended purpose of the precursor solution. So the primary issues are the maintenance of the organotin moieties in solution since precipitation of these moieties can render the compositions unprocessible. As the results demonstrate below, there can be measurable signs of evolution of the precursor solutions over time. In particular, even if inhibited, some gradual hydration can take place. While some systems can be stable for very long periods of time, others can precipitate in shorter periods of time. The objective of selecting the appropriate solvents and additives is to stretch any instability periods far enough into the future, such that an appropriate commercial shelf life is exceeded.

While water can result in hydration that destabilizes the precursor solutions, it is impractical to reduce the water to an effectively zero amount, although it can be reduced to low levels. Since trace amounts of water can be introduced from a range of potential sources, the effective way to address water issues is to control the water to low levels and to make the compositions resilient to low, non-zero, levels of water. An objective of the present invention is to support this resilience to provide desired shelf lives under reasonable commercial use. Applicant has previously considered adjustment of water levels for consistent results. This water adjustment is described in U.S. Pat. No. 11,300,876 to Jiang et al. (hereinafter the '876 patent), entitled "Stable Solutions of Monoalkyl Tin Alkoxides and Their Hydrolysis and Condensation Products," incorporated herein by reference. In general, it can be desirable to adjust (i.e., normalize) the water content of solvents used to form the stabilization compound enhanced organotin precursor solutions described herein. As described further below, the teachings of the '876 patent can be combined with the use of additives and cosolvents for stability as described herein.

Improving photoresist performance is desired in order to reduce the cost of manufacturing and to improve the yield of semiconductor device manufacturing. Organometallic materials, particularly those based on organotin compositions, have been shown to be high-performance photoresists that enable patterning of high-resolution and high-fidelity patterns. Organotin photoresists have been broadly described in U.S. Pat. No. 9,310,684B2 to Meyers et al. (hereinafter the '684 patent), entitled "Organometallic Solution Based High Resolution Patterning Compositions," U.S. Pat. No. 10,642,153B2 to Meyers et al., entitled "Organometallic Solution Based High Resolution Patterning Compositions and Corresponding Methods," and U.S. Pat. No. 10,228,618B2 entitled "Organotin Oxide Hydroxide Patterning Compositions, Precursors, and Patterning", all of which are incorporated herein by reference. In general, these organotin photoresist materials are deposited as coatings in which Sn atoms are associated in an oxo-hydroxo network through Sn—OH and Sn—O—Sn bonds along with intact Sn—C bonds. The intact Sn—C bonds prevent extended dense network formation, and thus maintain suitable solubility in developer. Exposure of organotin coatings to appropriate radiation sources, such as extreme ultraviolet (EUV), ultraviolet (UV), electron beams, and the like, results in cleavage of the Sn—C bond and allows for further densification of the exposed area, thereby increasing the solubility contrast between exposed and unexposed regions. In this way, patterning of the coating can be realized after development.

While a range of organotin compositions can be effective radiation patterning materials, compounds with a single carbon-tin bond have been found to provide desirable processing for patterning in a commercial context, and the following discussion focuses on these mono-organo tin compositions. Thus, the organotin precursor compositions can comprise a group of compositions ($RSnL_3$) that can be hydrolyzed with water or other suitable reagent under appropriate conditions to form the monohydrocarbyl tin oxo-hydroxo patterning compositions, which, when fully hydrolyzed, can be represented by the formula $RSnO_{(1.5-(x/2))}(OH)_x$ where $0<x\leq 3$. In general, R is a hydrocarbyl ligand, and L is a hydrolysable ligand, as further described below. It can be convenient to perform the hydrolysis to form the oxo-hydroxo compositions in situ, such as during deposition and/or following initial coating formation. In particular, triamides (L=amide) and trialkoxides (L=alkoxide) can be used under hydrolyzing conditions for forming radiation sensitive coatings for patterning, and current commercial products are based on trihydrocarbyloxides, such as trialkoxides. While the terminology follows convention for the hydrolysable ligands, it should be noted that these can comprise organo substituents of various substitutions with potential unsaturated bonds or heteroatom substitutions. The various precursor compounds with hydrolysable ligands generally carry forward the R-ligand to tin through the pre-irradiation process and are synthesized with this perspective. Hydrolysable ligands include, for example, alkoxide (hydrocarbyl oxide), acetylide or amide moieties. These compositions can be synthesized with a wide range of R ligands. As described, for example, in published U.S. patent application 2022/0064192 to Edson et al., entitled "Methods to Produce Organotin Compositions with Convenient Ligand Providing Reactants," incorporated herein by reference. In some embodiments, the organotin precursor compounds can be purified after synthesis by appropriate techniques such as fractional distillation, as described in published U.S. patent application 2020/0241413 to Clark et al., entitled "Monoalkyl Tin Trialkoxides and/or Monoalkyl Tin Triamides With Low Metal Contamination and/or Particulate Contamination, and Corresponding Methods," incorporated herein by reference.

R forms a carbon-tin bond wherein the carbon bound to the tin is $sp^a$ or $sp^2$ hybridized, and R can comprise heteroatoms, which are not carbon or hydrogen. As noted above, for convenience as well as consistency in the art, R can be interchangeably referred to as an alkyl ligand, organo ligand or hydrocarbyl ligand. Based on ligands properties, sp hybridized carbon bonding to tin forms an acetylide ligand, which is classified with the L-ligands and not the R-hydrocarbyl ligands. In some embodiments, alkyl ligands can be desirable for some patterning compositions where the compound can be represented generally as $R^1R^2R^3CSn\ O_{(2-(z/2)-(x/2))}(OH)_x$, where $R^1$, $R^2$ and $R^3$ are independently hydrogen or an alkyl group with 1-10 carbon atoms. Similarly, this representation of alkyl ligand R is similarly applicable to the other embodiments generally with $R^1R^2R^3CSn(L)_3$, with L corresponding to hydrolysable ligands, such as alkoxide (hydrocarbyl oxide), acetylide or amide moieties. In some embodiments, $R^1$ and $R^2$ can form a cyclic alkyl moiety, and $R^3$ may also join the other groups in a cyclic moiety. Suitable branched alkyl ligands can be, for example, isopropyl ($R^1$ and $R^2$ are methyl and $R^3$ is hydrogen), tert-butyl ($R^1$, $R^2$ and $R^3$ are methyl), tert-amyl ($R^1$ and $R^2$ are methyl and $R^3$ is $—CH_2CH_3$), sec-butyl ($R^1$ is methyl, $R^2$ is $—CH_2CH_3$, and $R^3$ is hydrogen), neopentyl ($R^1$ and $R^2$ are hydrogen, and $R^3$ is $—C(CH_3)_3$), cyclohexyl, cyclopentyl, cyclobutyl, and cyclopropyl. Examples of suitable cyclic groups include, for example, 1-adamantyl ($—C(CH_2)_3(CH)_3(CH_2)_3$ or tricyclo (3.3.1.13,7) decane bonded to the metal at a tertiary carbon) and 2-adamantyl ($—CH(CH)_2(CH_2)_4(CH)_2(CH_2)$ or tricyclo(3.3.1.13,7) decane bonded to the metal at a secondary carbon). In other embodiments, hydrocarbyl groups may include aryl or alkenyl groups, for example, benzyl or allyl, or alkynyl groups. In other embodiments, the hydrocarbyl ligand R may include any group consisting solely of C and H and containing 1-31 carbon atoms. In summary, some examples of suitable alkyl groups bonded to tin include, for example, linear or branched alkyl (i-Pr ($(CH_3)_2CH—$), t-Bu ($(CH_3)_3C—$), Me ($CH_3—$), n-Bu ($CH_3CH_2CH_2CH_2—$)), cyclo-alkyl (cyclo-propyl, cyclo-butyl, cyclo-pentyl), olefinic (alkenyl, aryl, allylic), or alkynyl groups, or combinations thereof. In further embodiments, suitable R groups may include hydrocarbyl groups substituted with heteroatom functional groups including cyano, thio, silyl (and germanium analogs), ether, keto, ester, or halogenated groups or combinations thereof.

In some embodiments, the organotin composition comprises a mixture of organotin compounds having different R groups with the same and/or different L groups bound accordingly. In some embodiments, the organotin composition has R ligands comprising a blend of a linear alkyl ligand and a non-linear alkyl ligand. In some embodiments, a blend of a linear alkyl ligand and a non-linear alkyl ligand comprises a branched alkyl group, a cyclo-alkyl group, or an aryl group. In some embodiments, the organotin composition is a mixture of distinct organotin compounds having methyl ligands and t-butyl ligands, respectively. In some embodiments, the precursor compositions comprise a blend of organotin compounds having the same and/or different L groups. In some embodiments, the organotin composition comprises distinct organotin compounds with L ligands comprising a dialkylamide, an alkylsilylamide, an alkyloxide, an alkylacetylide, or a combination thereof. In other embodiments, the organotin composition comprises distinct organotin compounds with L ligands comprising methoxide, ethoxide, propoxide, iso-propoxide, butoxide, iso-butoxide, tert-butoxide, tert-amyloxide, dimethyl amide, diethyl amide, diiso-propyl amide, trimethylsilyl amide, or combinations thereof. In embodiments wherein a blend of different organotin compounds are used, any one of the distinct organotin compounds can comprise from about 1 mol. % to about 99 mol. % of the total organotin moles in some embodiments, from about 5 mol. % to about 95 mol. % of the total organotin moles in other embodiments, from about 10 mol. % to about 90 mol. % of the total organotin moles in other embodiments, and from about 15 mol. % to about 85 mol. % of the total organotin moles in further embodiments. In the Examples below, organotin precursor solutions comprising a mixture of two distinct alkyltin tri-tert-amyl alkoxide compounds are demonstrated. As is conventional in this art, the hydrocarbyl group can be referred to as an alkyl group even though the group can have unsaturated bonds, aryl groups, heteroatoms, and so forth.

In some embodiments the precursor compositions comprise a mixture of R—Sn moieties with hydrocarbyl ligands and $SnL'_4$ compounds, i.e., tin compounds without alkyl ligands bound directly to the metal, with L' corresponding to a hydrolysable ligand. In some embodiments L' can be the same as L, as described above. Additives and/or solvent blends as described herein can also coordinate with the tin(IV) ions of the $SnL'_4$ compounds to stabilize the $SnL'_4$ compounds against hydrolysis. Generally, these mixtures comprise at least about 0.5 mole percent of the SnL'4 component, in some embodiments at least about 1 mole percent, in some embodiments at least about 10 mole percent and in further embodiments at least about 25 mole percent of the $SnL'_4$ component. In other embodiments, the precursor compositions comprise one or more organotin compounds represented by the formula $RSnL_3$ and up to about 30 mole percent, up to about 20 mole percent, up to about 10 mole percent, or up to about 1 mole percent $SnL'_4$ relative to the total Sn. A person of ordinary skill in the art will recognize that additional ranges of mixture components within the explicit ranges above are contemplated and are within the present disclosure. In some embodiments, the components of the precursor compositions may be combined in solution and not separately formed as solid blends prior to, for example, formation of a coating. In other embodiments, the components of the precursor compositions may be mixed as solids prior to dissolution to form a precursor solution. In the Examples below, organotin precursor solutions comprising a mixture of an alkytin trialkoxide and a tin tetraalkoxide are demonstrated.

Most of the organotin precursor compounds of interest are room temperature liquids, although soluble solids can be similarly processed. As described below upon deposition and removal of solvent, the precursors can be hydrolyzed into a dry solid material. The organotin precursors are dissolved into a liquid to form a precursor solution. Generally, solvents interact with solutes to maintain the solutes in solution, and for ionic metal species, complex interactions are generally available. Tin +4 ($Sn^{+4}$ or Sn IV) can be hexadentate for ligand formation. The purified (neat) compounds generally have 4 ligands, although potentially some ligands can be bridging. Even without displacing any ligands, the precursor compounds may have two free ligand binding positions, which can bond to the solvent. If an appropriate cosolvent is present, the cosolvent, e.g., a linear alcohol, can compete for these ligand bonding positions with alternative cosolvent that may not as effectively bind to these ligand sites. Linear alcohols are generally effective to compete against other cosolvents, including water, to provide for the stabilization of the solution.

Also, the tin moieties can form clusters in solution if bridging ligands are available, so complex formation can be another complication with respect to solution stability. Some stable trimer clusters are described in U.S. Pat. No. 11,098,070 to Cardineau et al, entitled "Organotin Clusters, Solutions of Organotin Clusters, and Application to High Resolution Patterning," and stable dodecamer clusters are described in U.S. Pat. No. 11,392,028 to Cardineau et al., entitled "Tin Dodecamers and Radiation Patternable Coatings with Strong EUV Absorption," both of which are incorporated herein by reference. These clusters can have oxygen atoms, hydroxide ions and/or carboxylate ions as bridging ligands. The identification of these and other known stable tin clusters points to the potential of forming transient clusters in precursor solutions, which can influence solution stability. For example, agglomeration of clusters can result in particulate nucleation.

In general, organometallic solutions can be very complex and involve various equilibria. Some of the known chemistries can be used to extrapolate observed properties. Constraints on the ability to interrogate the details of the solution structures implies that pictures are necessarily incomplete. This incompleteness does not diminish the ability to control the process to a significant degree or the success that has been achieved using the additives and/or cosolvents as described herein to stabilize the precursor solutions.

The unwanted condensation of the tin compositions in solution are generally associated with water, although water may not be the only source of instability. While water can be designed in the processing to remain at low levels, it would be extremely difficult or impossible to completely eliminate water due to absorption from the ambient environment, which can include atmosphere, equipment, contaminants in reactants, and the like. For consistency in commercial processing, it is advantageous to design the system to be stable under achievable ranges at low water levels. The presence of some water promotes a tendency to hydrolyze ligands to introduce hydroxide or oxygen ligands that can bridge between tin atoms. The presence of potentially bridging ligands can promote cluster formation and potential condensation due to cluster agglomeration. Due to the complex equilibria in these solutions, as noted above, the amount of water present would tend to shift the equilibria. The additives and/or cosolvents described herein tend to shift the equilibria away from hydrolysis to stabilize the solutions. A measure of stability has been found in terms of resistance to reaction with water, which can be estimated by the amount of free measurable water remaining in the solution, although due to the complexities of the equilibria, does not account for the details of the species present. The decrease or halting of the consumptions of free measurable water in solution can be accomplished through the use of appropriate solvents and/or additives, and changes in water consumption over time can be evaluated relative to a 4-methyl-2-pentanol solvent reference with the composition and concentration of initial tin species being the same.

As noted above, reaction of monomeric $RSnL_3$ species with water, i.e., hydrolysis, generally leads to oligomeric organotin oxo-hydroxo clusters over time. Thus, while organotin oxo-hydroxo species can be successfully processed in solution to form radiation patterning materials as described in the '684 patent, many oxo-hydroxo organotin clusters have poor solubility and uncontrolled reaction of organotin precursors with water in solution can therefore lead to particulate formation and precipitation/agglomeration of insoluble species. Water is generally present in some concentration in most solvents unless great care is taken. Water absorption by solvents can occur in ambient conditions when exposed to air during manufacture, filtration and other processing, and in regular use. Water from ambient air can also permeate through container walls and lead to an increase in solvent water content. When installed onto a coating apparatus, such as a wafer track, the organotin photoresist solution is generally plumbed through various lines, tubing, tanks, pumps, and other equipment of materials of construction that can be susceptible to water permeation. Therefore, it is desirable to prepare organotin photoresist solutions that are resistant or tolerant to adverse hydrolysis in solution.

To achieve consistent processing results, it has been found beneficial to control water content of solvents used for processing even if they are at relatively low levels. In some embodiments, it can be desirable for organotin resist solutions be water-normalized, e.g., to comprise a specified amount of water as described the 876 patent referenced above. Common organotin precursors such as organotin trialkoxides and triamides readily hydrolyze, and reaction with different amounts of water can yield a variable distribution of species. As such, addition of a specific concentration of water to the organotin resist solution compositions can improve batch to batch reproducibility by facilitating the formation of similar distributions of hydrolyzed and non-hydrolyzed species. However, it is desirable to enable and/or enhance the solution-stability with respect to precipitation, agglomeration, and/or particulate formation for such water-normalized organotin resist solutions. Suitable stabilization compounds can effectively prevent continued hydrolysis and/or condensation from occurring in water-normalized organotin resist solutions. In the Examples below, improved shelf-life of organotin resist solutions and resistance to precipitation at elevated water levels is demonstrated by addition of additives or cosolvents in suitable quantities.

While in principle various methods can be used to evaluate the water content of the sample, Karl Fischer titration is an effective and practical approach. Karl Fischer (KF) titrators are commercially available for fast and automated evaluation. KF titrators are generally available from commercial suppliers such as Mettler-Toledo LLC (OH, USA), Metrohm AG (Switzerland), and CSC Scientific Company (VA, USA). The evaluation of free water of a sample can be useful for evaluating the efficacy of a given stabilization compound by comparing the concentrations of free water within stabilization compound-enhanced compositions and non-stabilization compound-enhanced compositions having similar organotin concentrations. While not wanting to be limited by theory, it is generally believed that for organotin solution compositions comprising suitable stabilization compounds, more free water is generally present in the corresponding stabilization compound-enhanced compositions compared to non-stabilization compound-enhanced compositions. Since water is consumed during hydrolysis, and for a given organotin precursor, stabilization compound-enhanced organotin solutions having more free water implies less hydrolysis has occurred compared to non-stabilization compound-enhanced organotin solutions. The concentration of free water in a sample is also referred to as the measured water content. The amount of water consumed during hydrolysis can be calculated as the initial water content minus the measured water content.

While hindering uncontrolled hydrolysis of organotin compositions in solution is generally desirable, it is also typically desired to hydrolyze and condense the organotin compositions during deposition and/or coating processing. For example, forming organotin oxide/hydroxide coatings generally involves hydrolysis of hydrolysable organotin compositions, such as $RSn(OR)_3$, $RSn(NR_2)_3$, and/or related organotin clusters, during spin coating and/or vapor deposition processes. During spin coating, solvent is rapidly evaporated from the substrate and the organotin compositions rapidly hydrolyze to afford an organotin oxo/hydroxo network. It is therefore desirable for a hydrolysis-hindering stabilization compound to enable sufficient hydrolysis and condensation of the organotin precursors to realize an organotin oxo/hydroxo network. This achievement of solution stability and processability involves a balance of ligand formation and strengths to allow for hydrolysis at desired stages and not excessively prior to use.

The rapid deposition process can lead to various species being trapped and/or incorporated into the organotin oxo/hydroxo network and undesirable species, such as particulates, can become incorporated or embedded into the organotin oxo/hydroxo network. Incorporation of particles can lead to inhomogeneity within the coating and can manifest as coating defects. Such coating defects can affect subsequent processing of the substrate by transferring the defects into further layers, and propagating further into the semiconductor fabrication process. Coating inhomogeneities can also lead to patterning defects. Inhomogeneities, such as particulates and other impurities, can interfere with pattern formation during exposure to patterned radiation and can result in poor image translation. Nanoscale patterning, i.e., patterning of features on the scale of tens of nanometers, requires resolution of features on a similar scale that can otherwise be disrupted by the presence of smaller inhomogeneities. For example, undesired particles can lead to a range of deleterious behavior such as a significant increase of feature roughness, increased microbridging, delamination and/or line wiggling, and missing portions of desired patterns (e.g., missing contacts).

Filtration can be effective at removing inhomogeneities such as particles from organotin resist solutions, and such methods have been described by Clark et al. in published U.S. Patent App. No 2020/0239498 (hereinafter the '498 application), entitled "Monoalkyl Tin Trialkoxides And/Or Monoalkyl Tin Triamides With Particulate Contamination And Corresponding Methods", incorporated herein by reference. However, through the mechanisms and reactions with water as described above, formation of additional hydrolysis/condensation products and particles can occur after an initial filtration. Thus, prevention of further particle formation is desirable, and organotin photoresist solutions can comprise suitable stabilization compounds in order to hinder uncontrolled hydrolysis during aging and handling, as described herein.

In some embodiments, a suitable stabilization compound can comprise molecules that drive complete replacement of a ligand on the organotin precursor species according to the following reaction:

$$RSnL_3 + 3\,HA \rightarrow RSnA_3 + 3HL.$$

In other embodiments, a suitable stabilization compound can comprise molecules that partially replace a ligand on the organotin precursor species according to the following reaction:

$$RSnL_3 + n\,HA \rightarrow RSnL_{3-n}(A)_n + n\,HL,\ 0 \le n < 3.$$

Some stabilization compounds may replace the $L^-$ ligands without transfer of a hydrogen atom to neutralize the ligand. Electrostatic charges suggest that the $L^-$ ligands likely primarily remain near the tin cation but would be appropriately solvated. The following describes such a possibility:

$$RSnL_3 + n\ A \rightarrow RSnL_{3-n}(A)_n + n\,L^-,\ 0 \le n < 3.$$

In further embodiments, a suitable stabilization compound can form a ligand to Sn at the 5th and possibly 6th ligand bonding position without displacing the initial ligands:

$$RSnL_3 + n\ A \rightarrow RSnL_3(A)_n,\ 0 < n \le 2.$$

Furthermore, a suitable stabilization compound can form a ligand in a blend of these functionalities as determined by the amounts of additive added and the equilibria according to the following reactions:

$$RSnL_3 + n\ HA \rightarrow RSnL_{3-m}(A)_n + m\ HL,\ 0 < n \le 5,\ 0 \le m \le 3,\ n \ge m.$$

In these formula, n and m are considered whole numbers rather than integers even though for any particular molecule, the species formed represent integers. As noted above, in the solution complex equilibria result in a mixture of various species.

Linear alcohols can be considered an HA additive, but these are separately identified herein as a cosolvent since they are generally present in greater concentrations. Suitable additives include carboxylic acids, polyols, amides, amino alcohols, diketones, mixtures thereof, and fluorinated derivatives thereof.

Precursor Solutions

The precursor solutions generally comprise one or more solvents, an organotin composition, and an optional additive. To avoid ambiguities, concentrations of the tin components are referenced relative to tin ions regardless of the bonding structure. The solvent can be a solvent blend with a linear alcohol cosolvent. Generally, for a stabilized solution as described herein, the precursor solution comprises a linear alcohol cosolvent, an additive, or a combination thereof.

With respect to organotin precursor solutions, the references to compositions generally relate to the species combined to form the solution. As averred to above, potential rearrangements resulting from the blends generally involve complex interrelated equilibria, which may settle into a relatively static steady state mixture of solvated moieties or may slowly evolve and potentially eventually destabilize. Thus, precise characterization of the species in solution is generally not known.

A precursor solution concentration can be conveniently specified based on tin ion molar concentration and concentrations of any other metals can be correspondingly specified through the molar fraction values for the metals relative to tin. In general, the precursor solution comprises from about 0.0005 M to about 1 M tin cation, in further embodiments from about 0.001 M to about 0.8 M, from about 0.001M to about 0.5 M, from about 0.01 M to about 0.5 M, and from about 0.025 M to about 0.5 M tin cation, as well as ranges with interchanged upper and lower limits as well as subranges. Highly purified precursor solutions with very low metal contaminants are described in published U.S. patent application 2020/0241413 to Clark et al., entitled "Monoalkyl Tin Trialkoxides and/or Monoalkyl Tin Triamides With Low Metal Contamination and/or Particulate Contamination, and Corresponding Methods," incorporated herein by reference. A person of ordinary skill in the art will recognize that additional ranges of tin/metal cation concentrations within the explicit ranges above are contemplated and are within the present disclosure.

Stability may be evaluated by the appearance of the precursor solutions. It is generally desirable for organotin compositions to possess sufficient stability, such as in regards to shelf life and performance consistency, for extended periods of time. As described herein, the stability of the precursor solutions can be effectively enhanced through the use of cosolvents and/or additives. Other aspects of the compositions can also influence stability, such as the selection of the alkyl ligands and/or through the control of the water content of the solution. Along with establishing the stability of the solutions, the stabilized organotin precursor solutions are expected to provide reliable reproducibility of coating processing and patterning results. As described in the Examples below, mixing either a linear alcohol or an additive with solutions comprising monoalkyl tin trialkoxide has been shown to mitigate effects of organotin resist precursor solution aging on photoresist patterning performance. Another way to evaluate cluster formation is to examine free water concentration over time. If hydrolysis is slowed or inhibited, water uptake may correspondingly be slowed or inhibited. The results in the Examples below are consistent with this. Thus, the change of free water over time from an initial value at mixing can provide information related to cluster formation. This can be references relative to current commercial resists using 4-methyl-2-pentanol solvent and no stabilization compounds.

Also, stability can be evaluated with respect to the amount of time before the observation of visible solids precipitating from solution. Applicant has developed organotin compositions formulated to be stable for significant amounts of time, which in some case exceeding 6 months or longer than a year. The further stabilization approaches described herein allow for stabilizing organotin compositions with a wider range of ligands so that patterning can be improved with a wider range of available ligands for patterning compositions. Using the stabilization compounds described herein, the average stability of the stabilized precursor solutions can be increased with respect to observation of visible solids. In some embodiments, the stabilized organotin precursor solution can have an average stability of at least a week longer, and in other embodiments at least a month longer, than a comparable organotin precursor solution without the stabilization compound when stored in a sealed container. A person of ordinary skill in the art will recognize that additional ranges of stability enhancement within the explicit ranges above are contemplated and are within the present disclosure.

The solvent can be selected to support stable dispersion of the organotin compounds. In some embodiments, solvent including a short chain linear alcohol can be used as a stabilization compound. Linear alcohols can be used as the only solvent if other solution properties are appropriate, or a cosolvent blended with other solvent components, with or without an additive as a stabilization agent. In addition to stably dispersing the organotin compounds, the precursor solutions should provide desired properties for processing radiation patternable compositions. Significant properties include, for example, solubility parameters, evaporation, flash point, toxicity and viscosity. For certain applications it is desirable for the organic solvent to have a flash point of no less than about 10° C., in further embodiments no less than about 20° C. and in further embodiment no less than about 25° C. Also, for drying purposes, it can be desirable for the solvent to have a boiling point of no more than about 250° C., in further embodiments no more than about 225° C. and in other embodiments no more than about 200° C. Suitable solvents can include, for example, aromatic compounds (e.g., xylenes, toluene), ethers (anisole, tetrahydrofuran), esters (propylene glycol monomethyl ether acetate, ethyl acetate, ethyl lactate), alcohols (e.g., 4-methyl-2-propanol, t-amyl alcohol, 1-butanol, 1-propanol, ethanol, methanol, isopropyl alcohol), ketones (e.g., diethyl ketone), mixtures thereof, and the like. For clarity purposes, any organic compound that falls within the additive description below is not considered a solvent within the terminology herein. For spin coating and other processing purposes, the precursor solution can have a viscosity from about 0.5 centipoise (cP) to about 50 cP, in further embodiments from about 1 cP to about 35 cP and in other embodiments from about 1.5 cP to about 25 cP. A person of ordinary skill in the art will recognize that additional ranges of flash points, boiling points and viscosity within the explicit ranges above are contemplated and are within the present disclosure.

For some precursor solutions, it is desirable to use a solvent blend with a cosolvent being an unbranched primary alcohol (linear alcohol) with no more than 6 carbon atoms ($CH_3(CH_2)_nOH$, $0 \leq n \leq 5$) or a blend thereof. These alcohols tend to be available for bonding as ligands to the tin ions without significant steric hindrance so that they can inhibit hydrolysis from trace water. In solvent blends, the linear alcohols can be referred to as cosolvents to identify them as a stabilization compound. These cosolvents can be blended with one or more other solvents to form a solvent blend, in which the solvent blend generally comprises from about 0.01 vol % to about 75 vol % unbranched primary alcohol relative to the total solvent, in additional embodiments from about 0.1 vol % to about 60 vol %, in some embodiments, from about 1 vol % to about 55 vol %, from about 5 vol % to about 45 vol %. and in further embodiments from about 25 vol % to about 40 vol % unbranched primary alcohol relative to the total solvent, as well as any other ranges mixing the lower and upper values of the presented ranges, such as from about 0.01 vol % to about 45 vol % or about 25 vol % to about 55 vol %. Using a solvent blend provides one or more additional parameters to adjust overall solution properties, and stabilization effects of linear alcohols are observed in such blends. A person of ordinary skill in the art will recognize that additional ranges within the explicit ranges of unbranched primary alcohol compositions above are contemplated and are within the present disclosure.

In some embodiments, the unbranched primary alcohols with no more than 6 carbon atoms may be used in solvent blends if their viscosities alone are undesirably low for certain uses, such as spin coating, to provide a higher flash point, or other potential pragmatic reasons, although using linear alcohols alone can be suitable in some embodiments. In some embodiments, both a linear (≤6 carbon) alcohol and an additive can be included in the organotin precursor solution as stabilization compounds. If the precursor solution has both one or more linear (≤6 carbon) alcohols and an additive, another solvent may or may not be included.

Additives can be added to provide a desired degree of stability. Unlike cosolvent, the amounts of additives are generally relatively low in a molar sense, although the upper limits for the additives may be roughly the same magnitude as the lower molar limits of the unbranched primary alcohols. Amounts of additives are generally referenced relative the tin concentration, in contrast with reference to the total solvent volume. Additives can be liquids or solids, as well as potentially dissolved gases. The effectiveness of a particular additive may depend on the properties of the organotin composition.

In some embodiments, suitable additives can comprise, for example, diols, carboxylic acids, amides (such as alkylureas, including dimethylurea), amino alcohols (such as $(ROH)_{3-n}NH_n$, n=0-2, including ethanolamine, diethanolamine, and triethanolamine), diketones (such as 1,3-diketones, including acetylacetone), formamide/alkylformamide (such as N,N-dimethylformamide), or triols (such as glycerol), mixtures thereof, fluorinated derivatives thereof, and the like. In general, suitable additives can be characterized by their volatility. For example, some additives are generally sufficiently volatile as to evaporate and volatilize during deposition and are not significantly incorporated into the organotin oxo/hydroxo coating. Conversely, in some embodiments, the additives may not be sufficiently volatile and may incorporate into the organotin oxo/hydroxo coating. In additional embodiments, an additive A may form a non-volatile and/or sufficiently non-hydrolysable Sn-A bond such as to at least partially incorporate into the organotin oxo/hydroxo coating. The additive is generally added in sufficiently low amounts that the remainder of some additive in deposited radiation sensitive compositions may not significantly interfere with formation of an oxo-hydroxo network following hydrolysis from available water during processing. In some embodiments, difunctional additives can participate as bridging ligands wherein the additive can bridge between two or more Sn atoms.

Some suitable examples of diol additives can include linear, branched, cyclic diols, and their isomers having between 1 and 6 carbons, for example, ethylene glycol, 1,2-propanediol, 1,3-propanediol, 1,2-butanediol, 1,3-propanediol, 1,4,-butanediol, 1,2-cyclopentanediol, 1,3-cyclopentanediol, 1,2-pentanediol, 1,3-pentanediol, 1,4-pentanediol, 1,5-pentanediol, 1,2-cyclohexanol, 1,3-cyclohexanol, 1,4-cyclohexanol, 1,2-hexanediol, 1,3-hexanediol, 1,4-hexanediol, 1,5-hexanediol, 1,6-hexanediol, and mixtures thereof. Similarly, glycerol is a triol with the formula $HOCH_2CHOHCH_2OH$. In some embodiments, diol or triol additives can comprise a mole ratio of diol to Sn from about 0.05 to about 5 mole ratio, in further embodiments the mole ratio can be from about 0.1 to about 2, and in further embodiments the mole ratio can be from about 0.5 to about 1.

In some embodiments, suitable examples of carboxylic acids can comprise R'COOH wherein R' is a linear, branched, or cyclic hydrocarbyl group having between 1 and 6 carbon atoms, fluorinated derivatives thereof, and associated isomers. Suitable examples of carboxylic acid additives can comprise, for example, formic acid, acetic acid, trifluoroacetic acid, propanoic acid, butyric acid, 2,2-dimethylpropanoic acid, iso-butyric acid, pentanoic acid, 2-methylbutanoic acid, 3-methylbutanoic acid, benzoic acid, cyclohexanoic acid, hexanoic acid, 2-methylpentanoic acid, 3-methylpetanoic acid, 4-methylpentanoic acid, and mixtures thereof. In some embodiments, carboxylic acid additives can comprise a mole ratio of carboxylic acid molecules to Sn from about 0.005 to about 10, in further embodiments the mole ratio can be from about 0.01 to about 6, from about 0.01 to about 5, from about 0.5 to about 3, from about 0.1 to about 2, from about 0.5 to about 1, from about 1 to about 2, and in further embodiments the mole ratio can be from about 1 to about 3.

In some embodiments, the additive can comprise suitable amino alcohols. In some embodiments, suitable amino alcohols can comprise, for example, compounds having both a hydroxyl (—OH) and an amino (—$NH_2$ group) and having from 1 and 6 carbon atoms. The amino alcohols can comprise linear, branched, or cyclic hydrocarbyl groups. Some examples of suitable amino alcohol additives can comprise, for example, ethanolamine, propanolamines (e.g., 1-amino- 2-propanol, 3-amino-1-propanol, 2-amino-1-propanol), butanolamines (e.g., 2-amino-2-methyl propanol, 1-amino-2-butanol, 2-amino-1-butanol, 3-amino-1-butanol, 4-amino-1-butanol), pentanolamines (e.g., 5-amino-1-pentanol, 4-amino-1-pentanol, 3-methyl-1-pentanol), diethanolamine, triethanolamine, diisopropanolamine, triisopropanolamine, and mixtures thereof. In some embodiments, the mole ratio of amino alcohol to Sn can be about 0.005 to about 10, in further embodiments the mole ratio can be from about 0.01 to about 6, from about 0.01 to about 5, from about 0.5 to about 3, from about 0.1 to about 2, from about 0.5 to about 1, from about 1 to about 2, and in further embodiments the mole ratio can be from about 1 to about 3.

In some embodiments, the additive can comprise a dialkylurea, for example dimethylurea, diethylurea, and the like, wherein the mole ratio of dialkylurea to Sn is from about 0.005 to about 10, in further embodiments the mole ratio can be from about 0.01 to about 6, from about 0.01 to about 5, from about 0.5 to about 3, from about 0.1 to about 2, from about 0.5 to about 1, from about 1 to about 2, and in further embodiments the mole ratio can be from about 1 to about 3.

In some embodiments, the additive can comprise unsubstituted and fluoro-substituted 1,3-diketones, for example, acetylacetone, trifluoroacetylacetone, hexafluoroacetylacetone, and mixtures thereof wherein the mole ratio of 1,3-diketone to Sn is about 0.005 to about 10, in further embodiments the mole ratio can be from about 0.01 to about 6, from about 0.01 to about 5, from about 0.5 to about 3, from about 0.1 to about 2, from about 0.5 to about 1, from about 1 to about 2, and in further embodiments the mole ratio can be from about 1 to about 3.

In some embodiments, the additive-enhanced photoresist solution can comprise one or more additives as described above. In some embodiments, the additive-enhanced photoresist solution can comprise one or more additives as described above as well as a linear alcohol as described above. A person or ordinary skill in the art will recognize that the ranges of additive amounts and mole ratios within the explicit ranges above are contemplated and are within the present disclosure. In general, a desired amount of additive would be dependent on the specific additive and its properties.

Stabilization compounds can generally be introduced into the organotin photoresist solutions in any suitable route. In some embodiments, the additive and/or the cosolvent can be added into the formulation solvent in an appropriate amount prior to the introduction of the organotin precursor(s). After addition of the additive and/or the cosolvent into the formulation solvent, the solvent can be mixed appropriately to ensure a homogenous solution. In other embodiments, the additive and/or the cosolvent can be added to the organotin precursor prior to the precursor's introduction to the formulation solvent. In other embodiments, the additive and/or the cosolvent can be added into a mixture of solvent and organotin precursor (i.e., the photoresist solution) and subsequently mixed appropriately.

The involvement of water in the processing has several potential dimensions. Water should generally be limited to encourage solution stability. As noted above, the water content can be normalized, and the normalization process is described in the '486 application cited above. While water normalization can be useful for stability control and consistency, the precursor solutions may or may not be subjected to water normalization through adjustment of the solvent water content. Whether or not solvent water content is normalized, the water content of the precursor solution can be monitored as a function of time to better understand the chemistry that may be taking place in the precursor solution.

With respect to water normalization, the selected water content can be set to a selected value within a tolerance of about ±15 percent, in some embodiments ±10 percent, in further embodiments ±8% and in other embodiments ±6%. As used herein, ppm is a short notation for μg/ml, which is ppm by weight for a solution density of 1 g/ml. The tolerance can be expressed in terms of absolute water quantities as ±50 ppm, in further embodiments ±40 ppm and in other embodiments ±25 ppm, although for larger selected water contents, the absolute tolerance may be larger from a practical perspective. In terms of absolute values of solvent water content, the solvent can be adjusted to have a water content from about 100 ppm to about 10,000 ppm, in further embodiments from about 200 ppm to about 6000 ppm, in other embodiments from about 300 ppm by weight to about 5000 ppm, and in some embodiments from about 300 ppm to about 4000 ppm and in additional embodiments from about 300 ppm to about 2500 ppm. A suitable water content may be somewhat dependent on the tin concentration in an adjusted precursor solution, so that a 0.5M tin solution may be stable with a larger water content than a 0.05M tin concentration in an adjusted precursor solution. A person of ordinary skill in the art will recognize that additional ranges of water tolerance or water content within the values given above are contemplated and are within the present disclosure.

As noted above, suitable additives/cosolvents can generally hinder or slow water from reacting with the organotin species in solution. Reaction of the organotin precursor species with water generally consumes free water to yield organotin oxo/hydroxo species in solution, and therefore measurement of free water differences of compositions comprising stabilization compounds against stabilization compound-free compositions can inform proper selection of suitable stabilization compounds. Free water can generally be measured in organic solvents through the use of a Karl Fischer titration method, as described above. Generally herein, the amount of free water in the solvent prior to formulation with the organotin composition, as measured by Karl Fischer titration, can be referred to as the initial water content, and the amount of free water in the precursor solution is referred to as the measured water content. The water content of an organotin solution immediately after preparation can also be referred to as an initial water content. In some embodiments, the initial water content of an organotin precursor solution can be equivalent within measurement error to the initial water content of the solvent used to prepare the solution. As described in the Examples below, suitable stabilization compounds can be chosen based on the relative difference in measured water content of the organotin precursor in the stabilization compound-containing precursor solution versus the otherwise equivalent non-stabilization compound-containing precursor solution. Alternatively, suitable stabilization compounds can be chosen based on the relative difference between initial water content and measured water content of a stabilization compound-containing precursor solution. Alternatively, suitable stabilization compounds can be chosen based on the measured water content of a stabilization compound-containing precursor solution evaluated at a period of time after preparation. In some embodiments, the period of time after preparation is less than one day, one day, 3 days, 7 days, one month, more than one month or other desired time interval. In some embodiments, suitable stabilization compounds comprise species that reduce the water uptake (i.e., have a higher measured water content after a specified period of time) of the organotin species relative to an otherwise non-stabilization compound-containing composition. For reference, an equivalent precursor solution without additives and with a 4-methyl-2-pentanol solvent can be used. A slower water uptake is believed to indicate a reduced hydrolysis of hydrolysable ligands that would correlate with cluster formation and precipitation.

In some embodiments, the stabilization compound-enhanced photoresist solution can be filtered to remove particles or insoluble defects. Generally, the particulates may not be visible, and the compositions are not known for the particulates. While some particulates may be sufficiently large clusters of organotin compositions, particulates can be debris from process equipment or composition impurities. Regardless of the identity of the particulate, they can be removed by the indicated processing. Suitable filtration methods are described in the '498 patent application cited above. The precursor solutions described herein can be processed to have very low particulate contamination and sealed in containers for storage and transport prior to use.

Particulate contamination in photoresist solutions can be generally detrimental to performance of the integrated devices derived from the lithographic patterning using the photoresist. For example, small particles can become embedded into the photoresist pattern to create inhomogeneities that can manifest as defects (e.g., scum, microbridges, line breaks, etc.) after development or after etch/pattern transfer, and thus decrease device yield. As described herein, particulates can comprise condensed organotin oxo/hydroxo species that result from hydrolysis/condensation processes in the solution. The additive compositions described herein can hinder such hydrolysis/condensation processes, and therefore hinder the formation of condensed organotin particulates.

Processing with Precursor Solutions

As noted above, the stability-enhanced photoresist solutions can be used to form radiation-patternable organotin oxo hydroxo compositions, and such coatings can be formed using any suitable method known in the art. Spin coating can be particularly desirable for forming coatings using the stabilization compound-enhanced photoresist solutions. In a typical spin coating process, a volume of the stabilization compound-enhanced photoresist solution is introduced onto the surface of a substrate, and the substrate is rotated at high speeds to drive rapid evaporation and condensation processes to enable the formation of a radiation patternable coating. In some embodiments, the substrate can be spun at rates (i.e., spin speeds) from about 500 rpm to about 10,000 rpm, in further embodiments from about 1000 rpm to about 7500 rpm, and in additional embodiments from about 2000 rpm to about 6000 rpm. The spin speed can be adjusted to obtain a desired coating thickness. The spin coating can be performed from about 5 seconds to about 5 minutes and in further embodiments from about 15 seconds to about 2 minutes. An initial low speed spin, e.g., at 50 rpm to 250 rpm, can be used to perform an initial bulk spreading of the composition across the substrate. A back side rinse, edge bead removal step, or the like can be performed with water or other suitable solvent to remove any edge bead. A person or ordinary skill in the art will recognize that additional ranges of spin coating parameters within the explicit ranges above are contemplated and are within the present disclosure.

A substrate generally presents a surface onto which the coating material can be deposited, and the substrate may comprise a plurality of layers in which the surface relates to an upper most layer. The substrate surface can be treated to prepare the surface for adhesion of the coating material. Prior to preparation of the surface, the surface can be cleaned and/or smoothed as appropriate. Suitable substrate surfaces can comprise any reasonable material. Some substrates of interest include, for example, silicon wafers, semiconductor wafers, silica substrates, other inorganic materials, polymer substrates, such as organic polymers, composites thereof and combinations thereof across a surface and/or in layers of the substrate. In some embodiments, the substrate can comprise a patterned structure such as described by Stowers et al. in U.S. Pat. No. 10,649,328, entitled "Pre-Patterned Lithography Templates, Process Based on Radiation Patterning Using The Templates And Processes To Form The Templates", incorporated herein by reference.

The thickness of the coating generally can be a function of the precursor solution concentration, viscosity and the spin speed for spin coating. For other coating processes, the thickness can generally also be adjusted through the selection of the coating parameters. In some embodiments, it can be desirable to use a thin coating to facilitate formation of small and highly resolved features in the subsequent patterning process. For example, the coating materials after drying can have an average thickness of more than about 250 nanometers (nm), in additional embodiments from about 1 nm to about 50 nm, in other embodiments from about 2 nm to about 40 nm, in other embodiments from about 1 nm to about 40 nm, and in further embodiments from about 3 nm to about 25 nm. A person of ordinary skill in the art will recognize that additional ranges of thicknesses within the explicit ranges above are contemplated and are within the present disclosure. The thickness can be evaluated using non-contact methods of x-ray reflectivity and/or ellipsometry based on the optical properties of the film. In general, the coatings are relatively uniform to facilitate processing. In some embodiments, such as high uniformity coatings on reasonably sized substrates, the evaluation of coating uniformity or flatness may be evaluated with, for example, a 1 centimeter edge exclusion, i.e., the coating uniformity is not evaluated for portions of the coating within 1 centimeter of the edge, although other suitable edge exclusions can be selected.

While heating may not be needed for successful application of the process, it can be desirable to heat the coated substrate to densify the coating material, to speed the processing, to increase the reproducibility of the process, and/or to facilitate vaporization of the hydrolysis by-products, such as alcohols and/or amines. In embodiments in which heating of the coated substrate is performed, the coated substrate can be heated to temperatures from about 45° C. to about 250° C., and in further embodiments from about 55° C. to about 225° C. The heating can generally be performed for at least about 0.1 minute, in further embodiments for about 0.5 minutes to about 30 minutes, and in additional embodiments from about 0.75 minutes to about 10 minutes. A person of ordinary skill in the art will recognize that additional ranges of heating temperatures and times within the explicit ranges above are contemplated and are within the present disclosure.

Generally, photoresist coatings can be patterned using radiation. Suitable radiation sources include extreme ultraviolet (EUV), ultraviolet (UV), or electron beam (EB) radiation. For fabrication of semiconductor devices, EUV radiation can be desirable due to its higher resolution compared to UV radiation, and its higher throughput compared to electron beam (EB)-based processing. Radiation can generally be directed to the substrate material through a mask or a radiation beam can be controllably scanned across the substrate to form a latent image within the resist coating.

Following International Standard ISO 21348 (2007) incorporated herein by reference, ultraviolet light extends between wavelengths of greater than or equal 100 nm and less than 400 nm. A krypton fluoride laser can be used as a source for 248 nm ultraviolet light. The ultraviolet range can be subdivided in several ways under accepted Standards, such as extreme ultraviolet (EUV) from greater than or equal 10 nm to less than 121 nm and far ultraviolet (FUV) from greater than or equal to 122 nm to less than 200 nm. A 193 nm line from an argon fluoride laser can be used as a radiation source in the FUV. EUV light has been used for lithography at 13.5 nm, and this light is generated from a Xe or Sn plasma source excited using high energy lasers or discharge pulses. Commercial sources of EUV photons include scanners fabricated by ASML Holding N.V. Netherlands. Soft x-rays can be defined from greater than or equal 0.1 nm to less than 10 nm.

The amount of electromagnetic radiation can be characterized by a fluence or dose which is obtained by the integrated radiative flux over the exposure time. For embodiments in which EUV radiation is used, suitable radiation doses can be from about 1 $mJ/cm^2$ to about 150 $mJ/cm^2$, in further embodiments from about 2 $mJ/cm^2$ to about 100 $mJ/cm^2$ and in further embodiments from about 3 $mJ/cm^2$ to about 50 $mJ/cm^2$. A person of ordinary skill in the art will recognize that additional ranges of radiation fluences within the explicit ranges above are contemplated and are within the present disclosure.

Following exposure to radiation and the formation of a latent image, a subsequent postexposure bake (PEB) is typically performed. In some embodiments, the PEB can be performed at temperatures from about 45° C. to about 250° C., in additional embodiments from about 50° C. to about 190° C. and in further embodiments from about 60° C. to about 175° C. The post exposure heating can generally be performed for at least about 0.1 minute, in further embodiments from about 0.5 minutes to about 30 minutes and in additional embodiments from about 0.75 minutes to about 10 minutes. A person of ordinary skill in the art will recognize that additional ranges of PEB temperatures and times within the explicit ranges above are contemplated and are within the present disclosure. The PEB can be designed to further consolidate the exposed regions without decomposing the un-exposed regions into a metal oxide.

Following performing a PEB, development of the image involves the contact of the patterned coating material including the latent image to a developer composition to remove either the un-irradiated coating material to form the negative image or the irradiated coating to form the positive image. Irradiated regions of organotin oxide hydroxide coatings are generally hydrophilic and are thus soluble in aqueous acids or bases and insoluble in organic solvents; conversely, non-irradiated regions are generally hydrophobic and are thus soluble in organic solvents and insoluble in aqueous acids or bases. For negative tone imaging, the developer can be an organic solvent, such as the solvents used to form the precursor solutions. In general, developer selection can be influenced by solubility parameters with respect to the coating material, both irradiated and non-irradiated, as well as developer volatility, flammability, toxicity, viscosity and potential chemical interactions with other process material. Some useful developer compositions for these organotin oxide photoresists have been described in published U.S. Patent Application No. 2020/0326627 to Jiang et al., entitled "Organometallic Photoresist Developer Compositions and Processing Methods", incorporated herein by reference.

It has also been discovered that solventless development, also referred to as dry development, can be employed with organotin materials. Dry development can include, for example, selective removal of the irradiated or non-irradiated regions of the photoresist by exposing the material to an appropriate plasma or appropriate flowing gas. Dry development of organotin resists has been described in PCT Publication No. 2020/132281A1 by Volosskiy et al., entitled "Dry Development of Resists", and in U.S. Provisional Application No. 63/247,885 by Cardineau et al., entitled "High Resolution Latent Image Processing and Thermal Development", both of which are incorporated herein by reference. In such dry development processes, development can be achieved by exposing the irradiated substrate to a plasma or a thermal process while flowing a gas comprising a small molecule reactant that facilitates removal of irradiated or non-irradiated regions. Following development, a rinse step can be conducted if desired to further remove undesired material from the pattern, and such methods have been described in published U.S. Patent Application No. 2020/0124970 to Kocsis et al., entitled "Patterned Organometallic Photoresists and Methods of Patterning," incorporated herein by reference.

After completion of the development step including any optional rinses, the coating materials can be heat treated to further condense the material and to further dehydrate, densify, or remove residual developer from the material. This heat treatment can be particularly desirable for embodiments in which the oxide coating material is incorporated into the ultimate device, although it may be desirable to perform the heat treatment for some embodiments in which the coating material is used as a resist and ultimately removed if the stabilization of the coating material is desirable to facilitate further patterning. In particular, the bake of the patterned coating material can be performed under conditions in which the patterned coating material exhibits desired levels of etch selectivity. In some embodiments, the patterned coating material 5 can be heated to a temperature from about 100° C. to about 600° C., in further embodiments from about 175° C. to about 500° C. and in additional embodiments from about 200° C. to about 400° C. The heating can be performed for at least about 1 minute, in other embodiment for about 2 minutes to about 1 hour, in further embodiments from about 2.5 minutes to about 25 minutes. The heating may be 10 performed in air, vacuum, or an inert gas ambient, such as Ar or $N_2$. A person of ordinary skill in the art will recognize that additional ranges of temperatures and time for the heat treatment within the explicit ranges above are contemplated and are within the present disclosure. Likewise, nonthermal treatments, including blanket UV exposure, or exposure to an oxidizing plasma such as 02 may also be employed for similar purposes.

Such patterning processes are generally steps in device formation that would involve substrate etchings and/or depositions based on the patterns formed in the resist materials. Repeated lithographic steps can be performed to make stacks of materials to form desired devices.

EXAMPLES

Example 1: Demonstration of Increased Coordination Number (CN)

The following example demonstrates that the addition of a linear alcohol cosolvent can increase the Sn coordination number of an organotin precursor.

A series of organotin solutions were prepared by first preparing solvent compositions having specific volume ratios of 4-methyl-2-pentanol to n-propanol according to Table 1 below, with each solvent composition normalized to contain a target initial water content of 300 ppm. As used herein, ppm refers to micrograms per milliliter (μg/ml, which would be equal to ppm by mass for a solvent density of 1 g/ml). As described in the Jiang et al. '876 patent cited above, water normalization was achieved by mixing an appropriate and known amount of 4-methyl-2-pentanol or n-propanol having a known concentration of water.

TABLE 1

| Solvent Composition (Vol. Percents) | Organotin Solution |
|---|---|
| 100% 4-methyl-2-pentanol | A |
| 75% 4-methyl-2-pentanol/ 25% n-propanol | 25P |
| 50% 4-methyl-2-pentanol/ 50% n-propanol | 50P |
| 25% 4-methyl-2-pentanol/ 75% n-propanol | 75P |
| 100% n-propanol | P |

Figure 2:
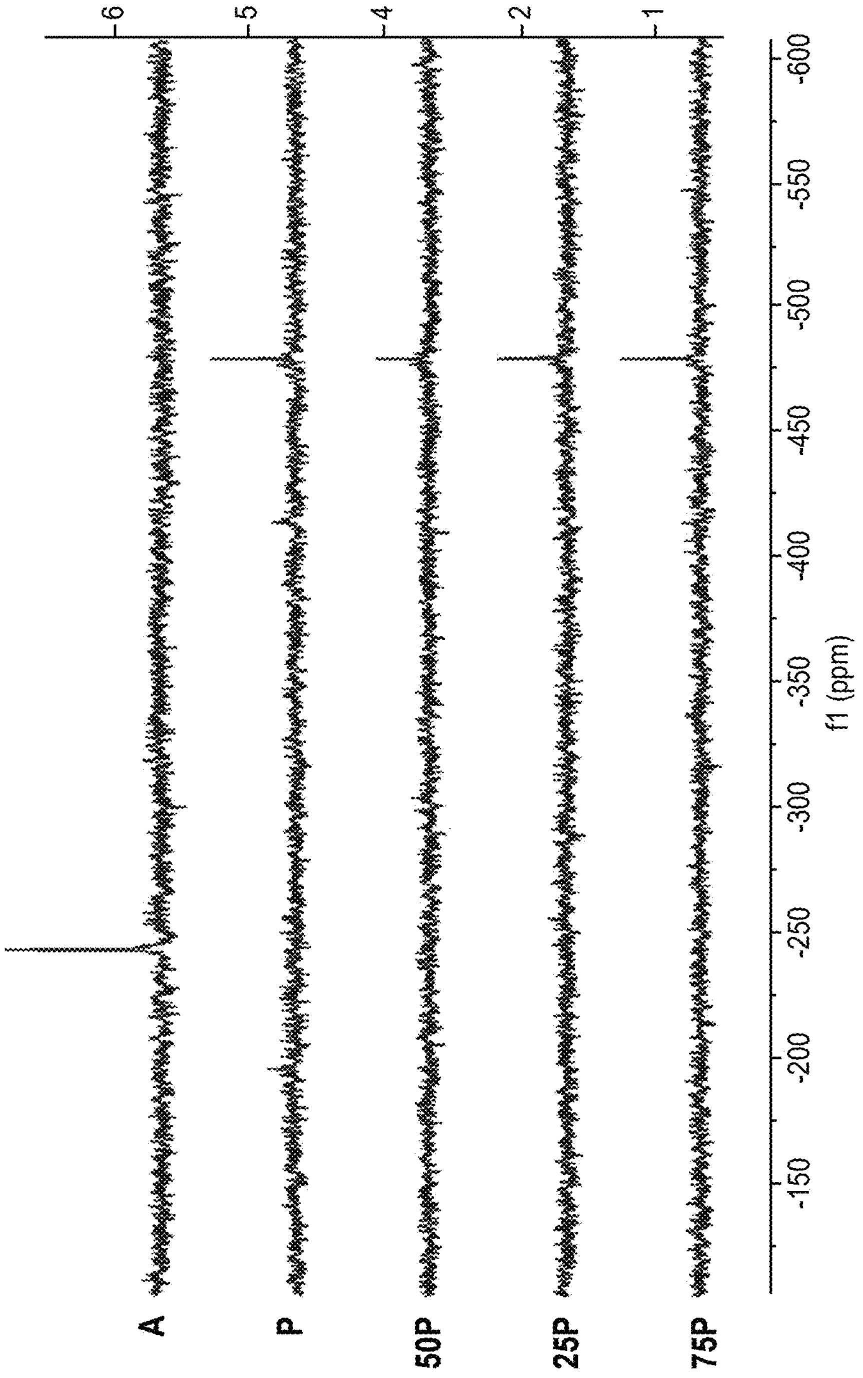
FIG. 2 is a series of $^{119}$spectra of the organotin solutions of FIG. 1 after storage of 30 days at room temperature.

Organotin precursor R1 comprising a mixture of two distinct alkyltin tri-tert-amyl alkoxide compounds (e.g., $R_1Sn(OtAmyl)_3$ and $R_2Sn(OtAmyl)_3$) was then added to each solvent composition to afford a final Sn concentration of 0.05M, and were mixed thoroughly to form Organotin Solutions A, 25P, 50P, 75P, and P. There was no evidence of precipitation in the Organotin Solutions. Aliquots were prepared for NMR analysis by diluting each Organotin Solution with $C_6D_6$ in a 1 to 1 ratio, and then were analyzed on a 400 MHz Bruker NMR spectrometer. $^{119}$Sn NMR analysis was conducted on aliquots of Samples A, 25P, 50P, 75P, and P immediately after formulation and again after storage of 30 days at room temperature, and the corresponding spectra are show in FIG. 1 and FIG. 2, respectively. Sample A shows a Sn peak around −250 ppm, which is consistent with literature reports of a 4-CN Sn environment. Conversely, the Samples 25P, 50P, 75P, and P indicate peaks at around −460 ppm, which is consistent with literature reports of 6-CN Sn. Thus, these results demonstrate that n-propanol bonds to $Sn^{4+}$ to add a fifth and sixth coordination ligand. It can be anticipated that solvent alkoxy groups substitute for the initial alkoxy groups due to the solvent concentrations shifting equilibria accordingly. The results also show no evidence of the addition of a fifth or a sixth coordination ligand in an organotin solution having only 4-methyl-2-pentanol as the solvent. The results suggest that the increased coordination number is due, at least in part, to the linear alcohol having less steric hindrance as compared to a secondary or tertiary solvent. The results further suggest that a blend of a linear alcohol with another cosolvent can provide a stabilization effect for an organotin solution.

Example 2: Water Consumption Mitigation with a Co-Solvent

The following example demonstrates that the addition of a linear alcohol cosolvent can reduce water consumption of organotin photoresists over time.

First, a series of solvent compositions comprising different volume ratios of 4-methyl-2-pentanol (4M2P) and n-propanol was prepared. One set of solvent compositions was normalized to contain a target initial water content of 300 ppm, and a second set was normalized to contain a target initial water content of 1000 ppm. Water normalization is described in Example 1. After preparation of each normalized solvent composition, Karl Fischer (KF) titration was performed to assess the actual initial water content in each solvent composition after normalization and solvent blending, and the results are presented in Table 2 below.

TABLE 2

| Solvent Composition | Target Initial Water Content (ppm) | Actual Initial Water Content (ppm) | Organotin Solution |
|---|---|---|---|
| 100% 4-methyl-2-pentanol | 300 | 280 | 0P1 |
| 75% 4-methyl-2-pentanol/ 25% n-propanol | 300 | 276 | 25P1 |
| 75% 4-methyl-2-pentanol/ 25% n-propanol | 300 | 279 | 50P1 |
| 25% 4-methyl-2-pentanol/ 75% n-propanol | 300 | 281 | 75 P1 |
| 100% n-propanol | 300 | 299 | 100P1 |
| 100% 4-methyl-2-pentanol | 1000 | 1065 | 0P2 |
| 75% 4-methyl-2-pentanol/ 25% n-propanol | 1000 | 1022 | 25P2 |
| 50% 4-methyl-2-pentanol/ 50% n-propanol | 1000 | 1031 | 50P2 |
| 25% 4-methyl-2-pentanol/ 75% n-propanol | 1000 | 1015 | 75P2 |
| 100% n-propanol | 1000 | 1052 | 100P2 |

Figure 3:
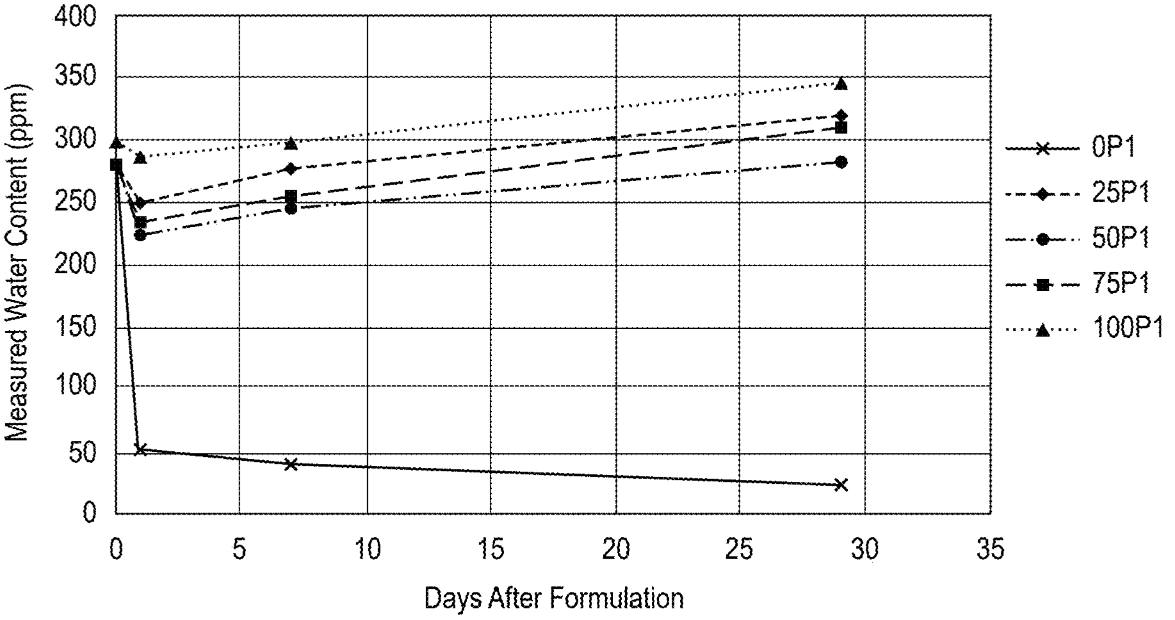
FIG. 3 is a plot of measured water content versus days after formulation for a set of organotin solutions prepared with 4-methyl-2-pentanol solvent and various percentages of n-propanol co-solvent, with each solvent composition normalized to 300 ppm water.
Figure 4:
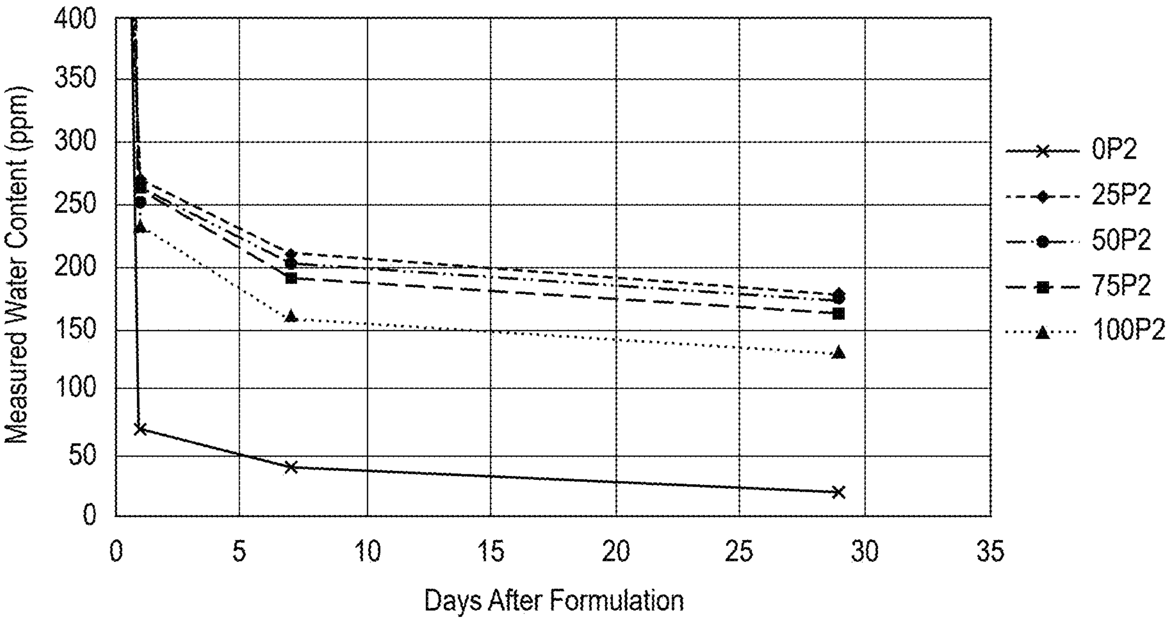
FIG. 4 is a plot of measured water content versus days after formulation for a set of organotin solutions prepared with 4-methyl-2-pentanol solvent and various percentages of n-propanol co-solvent, with each solvent composition normalized to 1000 ppm water.

Organotin precursor R1 comprising a mixture of two distinct alkyltin tri-tert-amyl alkoxide compounds (e.g., $R_1Sn(OtAmyl)_3$ and $R_2Sn(OtAmyl)_3$) was then added to each solvent composition to afford a final Sn concentration of 0.05M. The solutions were mixed thoroughly to form Organotin Solution samples 0P1, 25P1, 50P1, 75P1, 100 P1, 0P2, 25P2, 50P2, 75P2 and 100P2, as shown in Table 2. KF titration was performed on each sample after 1 day, 7 days, and 29 days of storage in a sealed bottle at room temperature to determine how much water was consumed over time in each sample. The results are plotted in FIG. 3 for the samples prepared with an initial 300 ppm water content (the "P1" samples) and in FIG. 4 for the samples prepared with an initial 1000 ppm water content (the "P2" samples).

In both figures, it can be seen that much less water is consumed for samples containing n-propanol than for the samples that only contain 4M2P. For samples 25P1, 50P1, 75P1, and 100P1 that originally contained about 300 ppm water, the measured water content after 1 day had only been modestly reduced to 250 ppm, 224 ppm, 233 ppm, and 285 ppm for 25P1, 50P1, 75P1, and 100P1, respectively. Conversely, the measured water content for 0P1 (e.g., the sample containing only 4M2P) had been significantly reduced to around 50 ppm after 1 day. For samples 25P2, 50P2, 75P2, and 100P2 that originally contained about 1000 ppm water, the measured water content after 1 day had been reduced to 268 ppm, 251 ppm, 261 ppm, and 233 ppm for 25P2, 50P2, 75P2, and 100P2, respectively. Conversely, the measured water content for 0P2 (e.g., the sample containing only 4M2P) had been significantly reduced to around 70 ppm after 1 day. In both data sets, the samples that contained only 4M2P consumed much more water from the solvent than the samples that contained n-propanol, indicating that a linear alcohol co-solvent like n-propanol is able to hinder hydrolysis of the organotin precursor compounds.

After aging each sample for 7 days, KF measurements were again performed on each sample to determine how much additional water had been consumed during storage. As before, the samples 25P1, 50P1, 75P1, and 100P1, having water concentrations of 275 ppm, 245 ppm, 254 ppm, and 297 ppm, respectively, all had significantly more free water than 0P1, having a measured water content of 40 ppm. Similarly, samples 25P2, 50P2, 75P2, and 100P2 had measured water content of 209 ppm, 201 ppm, 191 ppm, and 159 ppm after 7 days, whereas 0P2 had a measured water content of 39 ppm after 7 days.

Finally, each sample's measured water content was again analyzed by KF titration after 29 days of storage at room temperature. Samples 25P1, 50P1, 75P1, and 100P1 showed measured water contents of 318 ppm, 282 ppm, 310 ppm, and 345 ppm, respectively, whereas the non-cosolvent composition sample 0P1 showed a significantly lower measured water content of 24 ppm. Similarly, the 25P2, 50P2, 75P2, and 100P2 samples showed measured water contents of 178 ppm, 174 ppm, 165 ppm, and 131 ppm, respectively, whereas the non-cosolvent composition sample 0P2 showed a significantly lower measured water content of 20 ppm.

Furthermore, it can be seen that the measured water content for non-cosolvent composition samples 0P1 and 0P2 continued to reduce over time, indicating that the organotin precursor continued to react with and consume water in non-cosolvent compositions. Furthermore, referring to FIGS. 3 and 4, respectively, it can be seen that the measured water content for the co-solvent compositions 25P1, 50P1, 75P1, and 100P1 increased as a function of time, while the measured water content for co-solvent compositions 25P2, 50P2, 75P2, and 100P2 decreased as a function of time. This result suggests that ambient water is incorporated into the samples over time and the samples with an initial 300 ppm water content are much more resistant to hydrolysis than samples with a higher initial water content. This result suggests that pairing a minimal and controlled initial water content with a linear alcohol cosolvent can provide a more effective hinderance to hydrolysis and thus consumption of free water, although as noted above, the details of the equilibria can be complicated.

This behavior indicates that non-cosolvent compositions, such as 0P1 and 0P2, consume much more water than compositions with a linear alcohol cosolvent present and is evidence that hydrolysis can be hindered in cosolvent-enhanced compositions.

Example 3: Shelf-Life

This example describes an improvement of shelf-life of organotin resists solutions having various additives.

Three organotin precursors R1, R2, R3 were used to prepare a variety of additive-enhanced photoresist solutions. R1 comprises a mixture of two alkyltin tri-tert-amyl alkoxide compounds (e.g., $R_1Sn(OtAmyl)_3$ and $R2Sn(OtAmyl)_3$), and R2 and R3 separately comprise single and distinct alkyltin tri-tert-amyl alkoxide compounds. To test each additive's propensity to improve the shelf-life and resiliency-towards-precipitation of organotin compositions, three water-normalized stock solvents having different initial water contents were used as the dilution solvent. Water normalization is described in Example 1. For each combination, the samples were prepared by first preparing three stock solutions of 4-methyl-2-pentanol (4M2P) having target initial water contents of 300 ppm, 1000 ppm, and 3000 ppm. A control comparative example prepared with only 4M2P was prepared for each additive/4M2P combination to measure the improvement of each additive.

All samples were standardized to afford a final Sn concentration of 0.05M. For the samples with additives, the additives were added and mixed into the solvent prior to addition of organotin precursors R1, R2, and R3. Additives tested to enhance shelf-life of organotin solutions included acetic acid (AA), formic acid (FA), triethanolamine (TEA), and trifluoroacetic acid (TFA) and all were tested in two different additive to Sn molar ratios. For example, IAA represents a composition of 1 mole acetic acid to 1 mole Sn and 3AA represents a composition of 3 moles acetic acid to 1 mole Sn. The shelf-life stability of each additive composition was conducted by monitoring each sample for precipitation over the course of a month, and the results are presented in the table below and given a performance rating of A, B, C, D, and F as shown in Table 3 below.

TABLE 3

| Organotin | | Target Initial Water Content, ppm | | |
|---|---|---|---|---|
| Precursor | Additive: | 300 | 1000 | 3000 |
| R1 | none | A | A | C |
| | 1AA | A | A | A |
| | 3AA | A | D | B |
| | 1TEA | A | A | F |
| | 3TEA | A | A | A |
| | 1FA | A | A | A |
| | 3FA | A | A | A |
| | 1TFA | A | A | F |
| | 3TFA | A | A | A |
| R2 | none | B | D | F |
| | 1AA | A | A | B |
| | 3AA | A | F | D |
| | 1TEA | A | A | D |
| | 3TEA | A | A | A |
| | 1FA | A | B | B |
| | 3FA | A | A | C |
| | 1TFA | A | A | F |
| | 3TFA | A | A | A |
| R3 | none | A | A | F |
| | 1AA | A | D | D |
| | 3AA | A | F | D |
| | 1TEA | A | A | D |
| | 3TEA | A | A | A |
| | 1FA | A | F | F |
| | 3FA | F | F | F |
| | 1TFA | A | A | C |
| | 3TFA | A | A | B |

Rating:
A = stable >1 month
B = ppt observed <1 month
C = ppt observed <1 week
D = ppt observed <3 days
F = ppt observed <1 day The results in Table 3 above show that at the highest water concentration, the three non-additive control compositions have relatively poor stability and form precipitates in less than a week (R1) or less than a day (R2 and R3). Additionally, the non-additive control composition for R2 showed relatively poor stability at each water concentration which is attributed in part to the relatively poor solubility of organotin precursor R2 in organic solvents. The results suggest that the additives may improve the stability of the R2 solutions, in part, by improving the solubility of R2. All but one of the additive samples at the lowest initial water content (300 ppm) was stable for greater than a month. At an initial water content of 1000 ppm, the stability seems to be strongly dependent on additive composition for R3 and dependent on molar ratio of AA for R1 and R2. The results show that AA, TEA, FA, and TFA can improve stability with respect to precipitate formation at higher initial water content levels, indicating that these additives can be used to hinder the formation of insoluble species.

Example 4: Aging and Patterning Performance

This example shows how the presence of a cosolvent or an additive can mitigate effects related to aging of organotin resist solutions exposed to ambient air as a means for further evaluating precursor solution stability.

Organotin resist precursor R4 was used in all cases. R4 comprises a mixture of an alkyltin trialkoxide and tin tetraalkoxide in 4-methyl-2-pentanol to achieve a total Sn concentration of 0.044M wherein the tin tetralkoxide comprised 1% of the total Sn. These samples were not water normalized. Prior to the addition of the R4 precursor, either dimethylurea, methanol, or triethanolamine was added to the 4-methyl-2-pentanol solvent to achieve the sample concentrations, as shown in Table 4. The concentrations of dimethylurea and triethanolamine were in mole % relative to the total amount of Sn. After preparation of each sample, the volumes were divided into two sets: a control set and an aged set. The samples in the control set were capped and stored in a drawer for seven days at room temperature, whereas the samples in the aged set were stored in a fume hood and exposed to ambient air without a cap for seven days.

Each sample was then used to prepare radiation patternable coatings. Silicon wafers (100-mm diameter) with a native-oxide surface were used as substrates for thin-film deposition. The substrates were treated with a hexamethyldisilazane (HMDS) vapor prime prior to resist deposition. The solutions were spin-coated on the substrates at 900 rpm and baked for 2 minutes at 100° C. to form alkyltin oxide hydroxide resist coatings.

A linear array of 50 circular pads ~500 um in diameter were projected on the wafer using EUV light (Lawrence Berkeley National Laboratory Micro Exposure Tool, MET). Pad exposure times were modulated to deliver an increasing EUV dose (7% exponential step) to each pad. Resist and substrate were then subjected to a post-exposure bake (PEB) on a hotplate for 2 min at 160° C. The exposed films were dipped in 2-heptanone for 15 seconds and rinsed an additional 15 seconds with 2-heptanone to form a negative tone image, i.e., unexposed portions of the coating were removed. Residual resist thicknesses of the exposed pads were measured using a J. A. Woollam M-2000 Spectroscopic Ellipsometer. The measured thicknesses were normalized to the maximum measured resist thickness and plotted versus the logarithm of exposure dose to form characteristic curves for each resist at a series of PEB temperatures. The maximum slope of the normalized thickness vs log dose curve is defined as the photoresist contrast (γ) and the dose value at which a tangent line drawn through this point equals 1 is defined as the photoresist dose-to-gel, (Dg). In this way common parameters used for photoresist characterization may be approximated following Mack, C. Fundamental Principles of Optical Lithography, John Wiley & Sons, Chichester, U.K; pp 271-272, 2007, incorporated herein by reference.

Dose-to-gel values for each set of control and aged samples were measured, and a Dg difference between control and aged compositions are shown below in Table 4.

TABLE 4

| Sample | Aging Effect on Dose-to-Gel ($D_g$), % |
|---|---|
| 4M2P | −33.8 |
| 4M2P and 10 mol % dimethylurea | −1.9 |
| 4M2P and 10 vol % methanol | −0.6 |
| 4M2P and 5 mole % triethanolamine | 0.7 |
| 4M2P and 10 mole % triethanolamine | 1.1 |

For the compositions having a cosolvent or an additive in Table 4, the dose-to-gel value between control and aged samples is below 2%. Conversely, the composition that does not contain an additive (dimethylurea or triethanolamine) or cosolvent (methanol) showed an increase in Dg for the aged sample of greater than 30%. In other words, these results show that presence of an additive or cosolvent, even in small concentrations relative to the Sn, can mitigate aging effects induced by exposure to ambient atmosphere for seven days and thereby significantly preserve reproducibility of patterning performance.

Example 5: Water Consumption Mitigation with an Additive

The following example demonstrates that the addition of a diol additive can reduce water consumption of organotin photoresists over time.

A series of additive-enhanced solvent solutions were prepared by dissolving appropriate masses of ethylene glycol (EG) in 4-methyl-2-pentanol to form 0.05M, 0.1M, and 0.15M solutions, respectively. Prior to addition of EG, water was added to the 4-methyl-2-pentanol solvent to result in a water-normalized 4-methyl-2-pentanol having an initial water content of about 1000 ppm as measured by KF titration. After preparation of the additive-enhanced solvent solutions, organotin precursor R1 was then added to each sample and mixed thoroughly to afford a final Sn concentration of 0.05M in each solution. Samples A1, A2, and A3 had a molar ratio of additive to Sn of 1.0, 2,0, and 3.0, respectively. A control sample, having no additive, was also prepared having a Sn concentration of 0.05M in the 1000 ppm water-containing 4-methyl-2-pentanol. The samples are summarized in Table 5 below.

TABLE 5

| Sample Name | Sn concentration | EG concentration | Moles of EG/ Moles of Sn |
|---|---|---|---|
| A1 | 0.05M | 0.05M | 1.0 |
| A2 | 0.05M | 0.10M | 2.0 |
| A3 | 0.05M | 0.15M | 3.0 |
| Control | 0.05M | 0 | 0 |

Organotin precursor R1 comprised a mixture of two alkyltin tri-tert-amyl alkoxide compounds (e.g., $R_1Sn(OtAmyl)_3$ and $R2Sn(OtAmyl)_3$). Samples A1, A2, A3, and the Control, as described in Table 5 above, were each stored in a sealed bottle at room temperature, and KF titration was performed on each sample at various times to determine the measured water content at various time points. Samples were measured on the same day as formulation, 4 days after formulation, and 13 days after formulation. The amount of water consumed was calculated as the difference between the initial water content (e.g., 1000 ppm) and the measured water content, with the percent water consumed calculated as the amount of water consumed divided by the initial water content. The measured water content and the percent water consumed for each sample at 0 days after formulation, 4 days after formulation, and 13 days after formulation are summarized in Table 6 and graphically represented in FIG. 5.

TABLE 6

| Sample Name | Measured Water Content (% Water Consumed) at 0 Days | Measured Water Content (% Water Consumed) at 4 Days | Measured Water Content (% Water Consumed) at 13 Days |
|---|---|---|---|
| A1 | | 368 ppm (63.2%) | 300 ppm (70.0%) |
| A2 | | 641 ppm (35.9%) | 453 ppm (54.7%) |
| A3 | 886 ppm (11.4%) | 814 ppm (18.6%) | 647 ppm (35.5%) |
| Control | 378 ppm (62.2%) | 244 ppm (75.6%) | 214 ppm (78.6%) |

The measured water content for A3 and the Control were 886 ppm and 378 ppm, respectively, on the day of formulation. The Control consumed 62.2% of the 1000 ppm of the initial water while A3 consumed only 11.4% of the initial water. At 4 days after formulation and at 13 days after formulation, measured water content data was collected for all of the additive-enhanced samples and the Control. The results show that less water was consumed in the additive-enhanced solutions than in the control solution at each time period. Additionally, the results show that the percent water consumed for each sample increased over time, but the ethylene glycol additive can serve to delay the process. The results further show that the percent water consumed decreased as the molar ratio of ethylene glycol to tin increased from 1.0 (A1) to 3.0 M (A3), so adjustment of the molar ratio of the additive can be used to control the hydrolysis of the organotin species.

Figure 5:
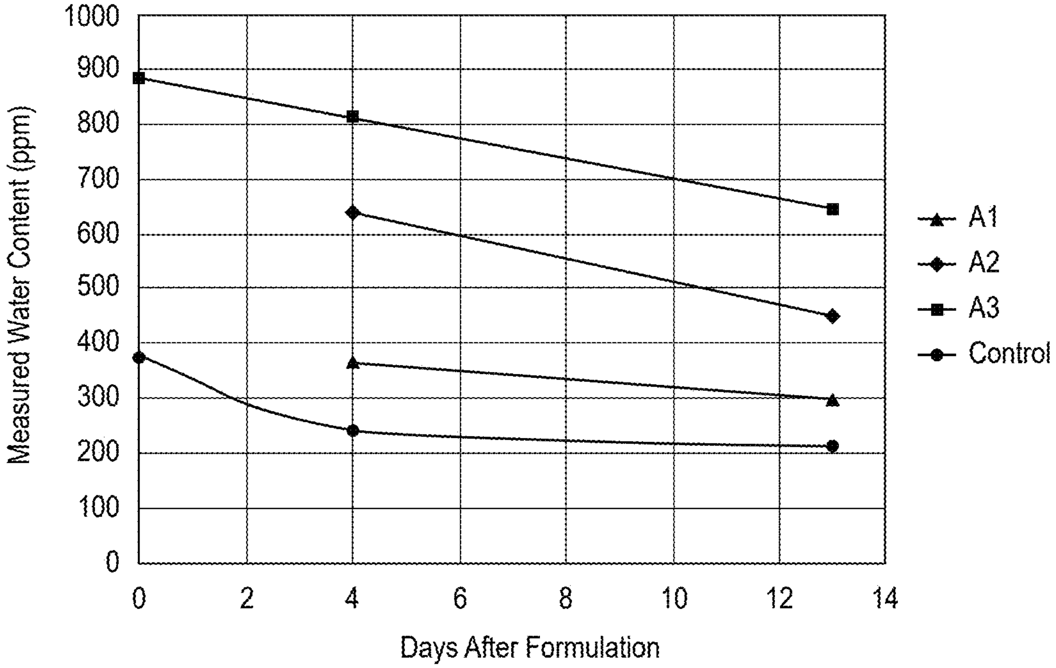
FIG. 5 is a plot of measured water content versus days after formulation for a set of organotin solutions prepared with 4-methyl-2-pentanol solvent normalized to 1000 ppm water and various concentrations of ethylene glycol additive.

FIG. 5 graphically shows that the measured water content in each sample decreases over time, yet at each time period, the measured water content (e.g. the amount of free water) is higher for the additive-containing samples A1, A2, and A3 than for the control sample.

The results suggest that the control solution, having no additive, allows relatively unhindered reaction between the hydrolytically sensitive organotin species and water. In contrast, the ethylene glycol additive competes with water for Sn binding sites and thereby hydrolysis in the organotin solution can be effectively hindered.

Further Inventive Concepts

A. An organotin precursor solution comprising a blend of an organic solvent, an additive, and an organotin composition represented by one or more organotin compounds represented by the formula $RSnL_3$, wherein each R is independently a hydrocarbyl ligand having from 1 to 31 carbon atoms and each L is a hydrolysable ligand, wherein the total concentration of Sn is from about 0.001M to about 0.5 M, wherein the additive is present at a concentration from about 0.01 moles to about 6 moles per mole of Sn, is not a monofunctional alcohol and coordinates with $Sn^{+4}$.

A2. The organotin precursor solution of claim A wherein the initial water content is no more than about 10,000 ppm.

A3. The organotin precursor solution of claim A wherein the initial water content is from about 100 ppm to about 10,000 ppm and wherein the organotin precursor solution has an average stability of at least a week longer than a comparable organotin precursor solution without the additive when stored in a sealed container.

A4. The organotin precursor solution of claim A wherein the measurable water content is at least about 100 ppm a week after preparation.

A5. The organotin precursor solution of claim A wherein the organic solvent comprises a primary alcohol, a secondary alcohol, a tertiary alcohol or a combination thereof.

A6. The organotin precursor solution of claim A wherein the organic solvent comprises a linear alcohol.

A7. The organotin precursor solution of claim A wherein the additive is present at a concentration from about 0.01 moles to about 0.5 moles per mole of Sn A8. The organotin precursor solution of claim A wherein the additive is present at a concentration from about 0.5 moles to about 6 moles per mole of Sn.

A9. The organotin precursor solution of claim A wherein at least a portion of the additive is coordinated with the $RSnL_3$ as a ligand.

A10. The organotin precursor solution of claim A wherein the additive comprises a diol, a triol, an amino alcohol, a diketone, or mixtures thereof.

A11. The organotin precursor solution of claim A wherein the additive is a linear compound, a branched compound, or a cyclic compound having from 1 to 6 carbon atoms.

A12. The organotin precursor solution of claim A wherein the additive comprises acetic acid, formic acid, trifluoroacetic acid or a combination thereof.

A13. The organotin precursor solution of claim A wherein the additive comprises ethylene glycol, propylene glycol, 1,2-butanediol, glycerol, triethanolamine, dimethylformamide, dimethylurea, or acetylacetone.

A14. The organotin precursor solution of claim A wherein the hydrocarbyl ligand comprises a linear alkyl group, a branched alkyl group, a cyclo-alkyl group, an aryl group, an alkenyl group, an alkynyl group, heteroatom derivatives thereof, or a combination thereof.

A15. The organotin precursor solution of claim A wherein the organotin composition comprises R ligands chosen from t-amyl, t-butyl, iso-propyl, n-butyl, methyl, or a combination thereof.

A16. The organotin precursor solution of claim A wherein the organotin composition has R ligands comprising a blend of a linear alkyl ligand and a non-linear alkyl ligand.

A17. The organotin precursor solution of claim A16 wherein the non-linear alkyl ligand comprises a branched alkyl group, a cycloalkyl group, or an aryl group.

A18. The organotin precursor solution of claim A wherein the organotin composition has R ligands comprising a blend of methyl ligands and t-butyl ligands.

A19. The organotin precursor solution of claim A wherein the organotin composition has L ligands comprising a dialkylamide, an alkylsilylamide, an alkyloxide, an alkylacetylide, or a combination thereof.

A20. The organotin precursor solution of claim A wherein the organotin composition has L ligands comprising methoxide, ethoxide, propoxide, iso-propoxide, butoxide, iso-butoxide, tert-butoxide, tert-amyloxide, or combinations thereof.

A21. The organotin precursor solution of claim A further comprising $SnL'_4$, wherein L' is a hydrolysable ligand that is the same or different than L, and wherein the concentration of the $SnL'_4$ is up to 20 mol. % of the total Sn.

A22. A radiation patternable film formed from the organotin precursor solution of claim A, wherein the radiation patternable film comprises an oxo-hydroxo network.

A23. The film of claim A22 wherein the oxo-hydroxo network is formed by hydrolysis.

A24. The film of claim A23 wherein the film, when fully hydrolyzed, can be represented by the formula $RSnO_{(1.5-(x/2))}(OH)_x$ where $0<x\leq3$.

B. A method for preparing a stabilized organotin precursor solution comprising:

- mixing an organotin precursor composition with an organic solvent and a stabilization compound to form the organotin precursor solution having a tin concentration from about 0.001M to about 0.5M, wherein the organotin precursor composition comprises one or more organotin compounds represented by the formula $RSnL_3$, wherein each R is independently a hydrocarbyl ligand having from 1 to 31 carbon atoms and each L is a hydrolysable ligand, wherein the organic solvent comprises an organic compound and a water content of no more than about 10,000 ppm prior to mixing and wherein the stabilization compound comprises a linear alcohol having from 1 to 6 carbon atoms and in a concentration of at least about 5 vol. % relative to the total solvent, an additive at a concentration from about 0.01 moles to about 6 moles per mole of Sn that is not a monofunctional alcohol and coordinates with $Sn^{+4}$, or a combination thereof.

B2. The method of claim B wherein the stabilization compound results in a slower rate of water consumption relative to the equivalent solution without the stabilization compound and formed with 4-methyl-2-pentanol solvent.

B3. The method of claim B wherein the organic solvent comprises a secondary or a tertiary alcohol or a combination thereof.

B4. The method of claim B wherein the stabilization compound comprises a diol, a triol, an amino alcohol, an amide, or a 1,3-diketone.

B5. The method of claim B wherein the additive comprises ethylene glycol, propylene glycol, 1,2-butanediol, glycerol, ethanolamine, diethanolamine, triethanolamine, dimethylformamide, dimethylurea, or acetylacetone.

B6. The method of claim B wherein the additive comprises a carboxylic acid.

B7. The method of claim B wherein the hydrocarbyl ligand comprises a linear alkyl group, a branched alkyl group, a cycloalkyl group, an aryl group, an alkenyl group, an alkynyl group, heteroatom derivatives thereof, or a combination thereof.

B8. The method of claim B wherein the organotin precursor composition comprises R ligands chosen from t-amyl, t-butyl, iso-propyl, n-butyl, methyl, or a combination thereof.

B9. The method of claim B wherein the organotin precursor composition has R ligands comprising a blend of a linear alkyl ligand and a non-linear alkyl ligand.

B10. The method of claim B wherein the organotin precursor composition has L ligands comprising methoxide, ethoxide, propoxide, iso-propoxide, butoxide, iso-butoxide, tert-butoxide, tert-amyloxide, or combinations thereof.

B11. The method of claim B further comprising purifying the organotin precursor composition prior to mixing.

B12. The method of claim B11 wherein purifying comprises fractional distillation and/or ultrafiltration.

B13. The method of claim B11 further comprising normalizing the water content of the organic solvent to no more than about 10,000 ppm prior to mixing.

B14. The method of claim B13 wherein the organic solvent has a normalized water content from about 100 ppm to about 5000 ppm.

B15. The method of claim B13 wherein the organic solvent has a normalized water content from about 100 ppm to about 1000 ppm.

B16. The method of claim B wherein the measurable water content of the stabilized organotin precursor solution is at least about 100 ppm a week after mixing.

B17. The method of claim B wherein the room temperature viscosity of the stabilized organotin precursor solution is from about 0.5 cP to about 50 cP.

B18. The method of claim B wherein the stabilized organotin precursor solution has an average stability of at least a week longer than a comparable organotin precursor solution without the stabilization compound when stored in a sealed container.

C. A method for forming an organotin precursor solution, the method comprising:

mixing a solvent composition and an organotin composition represented by one or more organotin compounds represented by the formula $RSnL_3$, wherein each R is independently a hydrocarbyl ligand having from 1 to 31 carbon atoms and each L is independently a hydrolysable ligand, wherein the total concentration of Sn is from about 0.001M to about 0.5 M, wherein the solvent composition comprises a linear alcohol with from 1 to 6 carbon atoms, an additive or both, and wherein the solvent composition is selected to reduce hydrolysis from trace water relative to an equivalent organotin precursor solution formed with 4-methyl-2-pentanol solvent due to more effective ligand formation with $Sn^{+4}$.

C2. The method of claim C wherein the slower rate of water consumption is due to more effective ligand formation with $Sn^{+4}$.

C3. The method of claim C wherein the organotin precursor solution has an initial water content from about 100 ppm to about 10,000 ppm.

C4. The method of claim C3 wherein the initial water content is normalized.

C5. The method of claim C wherein the selected solvent composition further comprises a secondary or a tertiary alcohol or a combination thereof.

C6. The method of claim C5 wherein mixing comprises mixing the secondary or the tertiary alcohol or a combination thereof and the organotin composition to form a first mixture and subsequently mixing the first mixture with the linear alcohol, the additive, or both.

C7. The method of claim C wherein the additive comprises a diol, a triol, an amino alcohol, an amide, or a 1,3-diketone.

C8. The method of claim C wherein the additive comprises ethylene glycol, propylene glycol, 1,2-butanediol, glycerol, ethanolamine, diethanolamine, triethanolamine, dimethylformamide, dimethylurea, or acetylacetone.

C9. The method of claim C wherein the additive comprises a carboxylic acid.

C10. The method of claim C wherein the hydrocarbyl ligand comprises a linear alkyl group, a branched alkyl group, a cycloalkyl group, an aryl group, an alkenyl group, an alkynyl group, heteroatom derivatives thereof, or a combination thereof.

C11. The method of claim C wherein the organotin composition comprises R ligands chosen from t-amyl, t-butyl, iso-propyl, n-butyl, methyl, or a combination thereof.

C12. The method of claim C wherein the organotin composition has R ligands comprising a blend of a linear alkyl ligand and a non-linear alkyl ligand.

C13. The method of claim C wherein the organotin composition has L ligands comprising methoxide, ethoxide, propoxide, iso-propoxide, butoxide, iso-butoxide, tert-butoxide, tert-amyloxide, or combinations thereof.

C14. The method of claim C further comprising purifying the organotin composition prior to mixing.

C15. The method of claim C4 wherein purifying comprises fractional distillation and/or ultrafiltration.

C16. The method of claim C further comprising normalizing the water content of selected the solvent composition to no more than about 10,000 ppm prior to mixing.

C17. The method of claim C16 wherein the selected solvent composition has a normalized water content from about 100 ppm to about 5000 ppm.

C18. The method of claim C16 wherein the selected solvent composition has a normalized water content from about 100 ppm to about 1000 ppm.

C19. The method of claim C wherein the measurable water content of the organotin precursor solution is at least about 100 ppm a week after mixing.

C20. The method of claim C wherein the room temperature viscosity of the organotin precursor solution is from about 0.5 cP to about 50 cP.

C21. The method of claim C wherein the organotin precursor solution has an average stability of at least a week longer than a comparable organotin precursor solution without the stabilization compound when stored in a sealed container.

The embodiments above are intended to be illustrative and not limiting. Additional embodiments are within the claims. In addition, although the present invention has been described with reference to particular embodiments, those skilled in the art will recognize that changes can be made in form and detail without departing from the spirit and scope of the invention. Any incorporation by reference of documents above is limited such that no subject matter is incorporated that is contrary to the explicit disclosure herein. To the extent that specific structures, compositions and/or processes are described herein with components, elements, ingredients or other partitions, it is to be understood that the disclosure herein covers the specific embodiments, embodiments comprising the specific components, elements, ingredients, other partitions or combinations thereof as well as embodiments consisting essentially of such specific components, ingredients or other partitions or combinations thereof that can include additional features that do not change the fundamental nature of the subject matter, as suggested in the discussion, unless otherwise specifically indicated.

What is claimed is:

1. An organotin precursor solution comprising an organic solvent and an organotin composition represented by one or more organotin compounds represented by the formula $RSnL_3$, wherein each R is independently a hydrocarbyl ligand having from 1 to 31 carbon atoms and each L is independently a hydrolysable ligand, wherein the total concentration of Sn is from about 0.001M to about 0.5 M, wherein the organic solvent comprises a solvent blend comprising one or more linear alcohols with from 1 to 6 carbon atoms, wherein the one or more linear alcohols are cosolvents present at a concentration from about 5 vol % to about 75 vol % relative to the total solvent, wherein the organotin precursor solution has an adjusted initial water content set at a selected target value from about 100 ppm to about 10,000 ppm and wherein the organotin precursor solution has a reduced rate of water dissipation relative to an equivalent organotin precursor solution formed with 4-methyl-2-pentanol.

2. The organotin precursor solution of claim 1 wherein the one or more linear alcohols have from 3 to 6 carbon atoms, and wherein the solution has a room temperature viscosity from about 0.5 cP to about 20 cP.

3. The organotin precursor solution of claim 1 wherein the adjusted initial water content is set at a selected target value from about 100 ppm to about 5,000 ppm.

4. The organotin precursor solution of claim 1 wherein the measurable water content is at least about 100 ppm a week after preparation.

5. The organotin precursor solution of claim 1 wherein the organic solvent comprises a secondary or a tertiary alcohol or a combination thereof.

6. The organotin precursor solution of claim 1 wherein the organic solvent comprises 4-methyl-2-pentanol.

7. The organotin precursor solution of claim 1 wherein the cosolvents comprise methanol, ethanol, n-propanol, n-butanol, 1-pentanol, or mixtures thereof.

8. The organotin precursor solution of claim 1 wherein the organic solvent comprises a blend of two primary alcohols.

9. The organotin precursor solution of claim 1 wherein the cosolvents are present at a concentration from about 25 vol % to 55 vol % relative to the total solvent.

10. The organotin precursor solution of claim 1 wherein at least a portion of the cosolvents are coordinated with the $RSnL_3$ as a ligand.

11. The organotin precursor solution of claim 10 wherein the organic solvent comprises a primary alcohol represented by the formula R'OH, wherein R' comprises a hydrocarbyl ligand having from 1 to 10 carbon atoms, and wherein the solution comprises a composition represented by the formula $RSnL_y([H]OR')_x$, wherein x is 1 or 2 or a combination thereof, where OR' may or may not be deprotonated and y is determined accordingly for charge balance.

12. The organotin precursor solution of claim 1 wherein the organotin precursor solution has no observable precipitation for at least a week when stored in a sealed container.

13. The organotin precursor solution of claim 1 wherein the hydrocarbyl ligand comprises a linear alkyl group, a branched alkyl group, a cycloalkyl group, an aryl group, an alkenyl group, an alkynyl group, heteroatom derivatives thereof, or a combination thereof.

14. The organotin precursor solution of claim 1 wherein the organotin composition comprises one or more R ligands chosen from t-amyl, t-butyl, iso-propyl, n-butyl, methyl, or a combination thereof.

15. The organotin precursor solution of claim 1 wherein the organotin composition has R ligands comprising a blend of a linear alkyl ligand and a non-linear alkyl ligand.

16. The organotin precursor solution of claim 15 wherein the non-linear alkyl ligand comprises a branched alkyl group, a cyclo-alkyl group, or an aryl group.

17. The organotin precursor solution of claim 1 wherein the organotin composition has R ligands comprising methyl ligands and t-butyl ligands.

18. The organotin precursor solution of claim 1 wherein the organotin composition has L ligands comprising a dialkylamide, an alkylsilylamide, an alkoxide, an alkylacetylide, or a combination thereof.

19. The organotin precursor solution of claim 1 wherein the organotin composition has L ligands comprising methoxide, ethoxide, propoxide, iso-propoxide, butoxide, iso-butoxide, tert-butoxide, tert-amyloxide, or combinations thereof.

20. The organotin precursor solution of claim 1 further comprising $SnL'_4$, wherein L' is a hydrolysable ligand that is the same or different than L, and wherein the concentration of the $SnL'_4$ is up to 20 mol. % of the total Sn.

21. The organotin precursor solution of claim 1 further comprising an additive, wherein the additive is present at a concentration from about 0.01 moles to about 3 moles per mole of Sn.

22. The organotin precursor solution of claim 21 wherein the additive comprises a diol, a triol, an amino alcohol, an amide, or a 1,3-diketone.

23. The organotin precursor solution of claim 21 wherein the additive comprises ethylene glycol, propylene glycol, 1,2-butanediol, glycerol, ethanolamine, diethanolamine, triethanolamine, dimethylformamide, dimethylurea, or acetylacetone.

24. The organotin precursor solution of claim 21 wherein the additive comprises a carboxylic acid represented by the formula R"COOH.

25. The organotin precursor solution of claim 24 wherein the precursor solution comprises a soluble composition represented by the formula $(RSn)_{12}O_{14}(OH)_{8-n}(O_2CR")_n$.

26. A radiation patternable film comprising an organotin composition having an oxo-hydroxo network that is formed from the organotin precursor solution of claim 1 under conditions allowing hydrolysis of hydrolysable ligands.

27. The film of claim 26 wherein the film, when fully hydrolyzed, can be represented by the formula $RSnO_{(1.5-(x/2))}(OH)_x$ where $0<x\leq3$.

28. A radiation patternable film formed from the organotin precursor solution of claim 21, wherein the radiation patternable film comprises additive ligands.

29. The organotin precursor solution of claim 1 wherein the cosolvents comprise n-propanol, n-butanol, 1-pentanol, or mixtures thereof.

* * * * *